(12) United States Patent
Stone et al.

(10) Patent No.: US 10,861,693 B2
(45) Date of Patent: Dec. 8, 2020

(54) CLEANING METHOD

(71) Applicant: Applied Materials, Inc., Santa Clara, CA (US)

(72) Inventors: Peter Stone, Los Gatos, CA (US); Christopher S. Olsen, Fremont, CA (US); Teng-fang Kuo, San Jose, CA (US); Ping Han Hsieh, San Jose, CA (US); Zhenwen Ding, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 15/375,683

(22) Filed: Dec. 12, 2016

(65) Prior Publication Data
US 2017/0178894 A1 Jun. 22, 2017

Related U.S. Application Data

(60) Provisional application No. 62/269,390, filed on Dec. 18, 2015, provisional application No. 62/269,456, filed on Dec. 18, 2015.

(51) Int. Cl.
*H01L 21/3065* (2006.01)
*H01L 21/02* (2006.01)
(Continued)

(52) U.S. Cl.
CPC .... *H01L 21/02057* (2013.01); *H01L 21/0262* (2013.01); *H01L 21/02063* (2013.01);
(Continued)

(58) Field of Classification Search
CPC ........... H01L 21/02057; H01L 21/0206; H01L 21/02063; H01L 21/02046;
(Continued)

(56) References Cited

U.S. PATENT DOCUMENTS 5,164,330 A * 11/1992 Davis ................ H01L 21/32115
257/E21.303
5,413,670 A * 5/1995 Langan ................ C23C 16/4405
134/1.2
(Continued)

FOREIGN PATENT DOCUMENTS

KR 10-2009-0058005 A 6/2009
WO WO 2017/106089 * 6/2017 ......... H01L 21/3065

OTHER PUBLICATIONS

International Search Report for PCT/US2016/066130.*
(Continued)

*Primary Examiner* — Mary A Wilczewski
(74) *Attorney, Agent, or Firm* — Patterson + Sheridan, LLP

(57) ABSTRACT

Implementations of the present disclosure generally relate to methods and apparatuses for epitaxial deposition on substrate surfaces. More particularly, implementations of the present disclosure generally relate to methods and apparatuses for surface preparation prior to epitaxial deposition. In one implementation, a method of processing a substrate is provided. The method comprises etching a surface of a silicon-containing substrate by use of a plasma etch process to form an etched surface of the silicon-containing substrate and forming an epitaxial layer on the etched surface of the silicon-containing substrate. The plasma etch process comprises flowing an etchant gas mixture comprising a fluorine-containing precursor and a hydrogen-containing precursor into a substrate-processing region of a first processing chamber and forming a plasma from the etchant gas mixture flowed into the substrate-processing region.

20 Claims, 6 Drawing Sheets

(51) Int. Cl.
  *H01L 21/67*      (2006.01)
  *H01L 21/687*     (2006.01)
  *H01L 21/322*     (2006.01)
  *H01L 21/311*     (2006.01)

(52) U.S. Cl.
  CPC .. *H01L 21/02532* (2013.01); *H01L 21/02661* (2013.01); *H01L 21/3065* (2013.01); *H01L 21/3221* (2013.01); *H01L 21/6719* (2013.01); *H01L 21/68742* (2013.01); *H01L 21/02046* (2013.01); *H01L 21/31116* (2013.01)

(58) Field of Classification Search
  CPC ......... H01L 21/31116; H01L 21/02532; H01L 21/02661; H01L 21/0262; H01L 21/3065; H01L 21/3221; H01L 21/6719; H01L 21/68742
  See application file for complete search history.

(56) References Cited

U.S. PATENT DOCUMENTS

| | | | | |
|---|---|---|---|---|
| 5,888,906 | A * | 3/1999 | Sandhu | H01L 21/02063 134/1.3 |
| 5,981,398 | A * | 11/1999 | Tsai | H01L 21/32136 257/E21.311 |
| 6,110,836 | A * | 8/2000 | Cohen | H01L 21/31116 134/1.2 |
| 6,255,179 | B1 * | 7/2001 | Cantell | H01L 21/02054 257/E21.165 |
| 6,584,987 | B1 * | 7/2003 | Cheng | B08B 7/0035 134/1.1 |
| 7,078,312 | B1 | 7/2006 | Sutanto et al. | |
| 7,517,804 | B2 | 4/2009 | Kiehlbauch et al. | |
| 7,651,948 | B2 | 1/2010 | Kim et al. | |
| 7,951,683 | B1 | 5/2011 | Shanker | |
| 8,501,629 | B2 | 8/2013 | Tang et al. | |
| 8,741,778 | B2 | 6/2014 | Yang et al. | |
| 9,034,773 | B2 * | 5/2015 | Thedjoisworo | H01L 21/3065 438/723 |
| 9,064,816 | B2 | 6/2015 | Kim et al. | |
| 9,093,390 | B2 | 7/2015 | Wang et al. | |
| 9,558,928 | B2 * | 1/2017 | Thedjoisworo | H01L 21/02063 |
| 2003/0192568 | A1 * | 10/2003 | Zheng | B08B 7/00 134/1.1 |
| 2005/0258137 | A1 * | 11/2005 | Sawin | C23C 16/4405 216/58 |
| 2006/0016459 | A1 * | 1/2006 | McFarlane | C23C 16/4405 134/1.1 |
| 2006/0118520 | A1 * | 6/2006 | Morikita | C23F 4/00 216/67 |
| 2009/0101928 | A1 * | 4/2009 | Kim | H01L 33/42 257/98 |
| 2009/0166328 | A1 * | 7/2009 | Kishimoto | H01J 37/3244 216/67 |
| 2009/0183771 | A1 * | 7/2009 | Sannomiya | C23C 16/24 136/258 |
| 2010/0112793 | A1 * | 5/2010 | Porshnev | H01J 37/32412 438/513 |
| 2010/0178600 | A1 | 7/2010 | Chandrachood et al. | |
| 2010/0273290 | A1 | 10/2010 | Kryliouk | |
| 2013/0045605 | A1 * | 2/2013 | Wang | H01L 21/31116 438/723 |
| 2013/0052827 | A1 * | 2/2013 | Wang | H01J 37/32357 438/694 |
| 2013/0059440 | A1 * | 3/2013 | Wang | H01L 21/3065 438/694 |
| 2013/0068390 | A1 | 3/2013 | Sanchez et al. | |
| 2014/0004708 | A1 * | 1/2014 | Thedjoisworo | H01L 21/3065 438/723 |
| 2014/0069459 | A1 * | 3/2014 | Guan | H05H 1/24 134/1.1 |
| 2014/0141621 | A1 * | 5/2014 | Ren | H01J 37/32357 438/724 |
| 2014/0166618 | A1 * | 6/2014 | Tadigadapa | H01J 37/32357 216/67 |
| 2014/0199850 | A1 * | 7/2014 | Kim | H01L 21/31122 438/722 |
| 2014/0232263 | A1 | 8/2014 | Nguyen et al. | |
| 2015/0040822 | A1 | 2/2015 | Olsen et al. | |
| 2015/0050753 | A1 | 2/2015 | Srinivasan et al. | |
| 2015/0126039 | A1 * | 5/2015 | Korolik | H01L 21/3065 438/718 |
| 2015/0126040 | A1 * | 5/2015 | Korolik | H01L 21/3065 438/718 |
| 2015/0170935 | A1 * | 6/2015 | Wang | H01L 21/32136 438/720 |
| 2016/0064212 | A1 * | 3/2016 | Thedjoisworo | H01L 21/02063 438/710 |
| 2016/0071722 | A1 * | 3/2016 | Miura | C23C 16/45551 438/694 |
| 2016/0260616 | A1 * | 9/2016 | Li | H01L 21/3065 |
| 2017/0323825 | A1 * | 11/2017 | Tomura | H01L 21/3065 |
| 2018/0076031 | A1 * | 3/2018 | Yan | H01L 21/02661 |
| 2018/0166303 | A1 * | 6/2018 | Tabata et al. | H01L 21/67069 |
| 2018/0330958 | A1 * | 11/2018 | Kumakura et al. | H01L 21/3065 |

OTHER PUBLICATIONS

Written Opinion of the International Searching Authority for PCT/US2016/0066130.*

Ruzyllo, Jerzy, Semiconductor Glossery, A Resource for Semiconductor Community, 2nd Edition, Nov. 2016, http://www.semi1source.com/glossary/default.asp?searchterm=native+oxide.*

International Search Report and Written Opinion in related application PCT/US 2016/066130 dated Mar. 20, 2017.

* cited by examiner

CLEANING METHOD

CROSS-REFERENCE TO RELATED APPLICATIONS

This application claims benefit of U.S. provisional patent application Ser. No. 62/269,390, filed Dec. 18, 2015 and U.S. provisional patent application Ser. No. 62/269,456, filed Dec. 18, 2015. Both of the aforementioned related patent applications are incorporated by reference herein in their entirety.

BACKGROUND

Field

Implementations of the present disclosure generally relate to methods and apparatuses for epitaxial deposition on substrate surfaces. More particularly, implementations of the present disclosure generally relate to methods and apparatuses for surface preparation prior to epitaxial deposition.

Description of the Related Art

Integrated circuits are formed in and on silicon and other semiconductor substrates. In the case of single crystal silicon, substrates are made by growing an ingot from a bath of molten silicon, and then sawing the solidified ingot into multiple wafers. An epitaxial silicon layer may then be formed on the monocrystalline silicon wafer to form a defect-free silicon layer that may be doped or undoped. Semiconductor devices, such as transistors, are manufactured from the epitaxial silicon layer. The electrical properties of the formed epitaxial silicon layer will generally be better than the properties of the monocrystalline silicon substrate.

As circuit densities increase for next generation devices, the widths of interconnects, such as vias, trenches, contacts, gate structures and other features, as well as the dielectric materials therebetween, decrease to 45 nm and 32 nm dimensions, whereas the thickness of the dielectric layers remain substantially constant, with the result of increasing the aspect ratios of the features. In order to enable fabrication of next generation devices and structures, three-dimensional (3D) stacking of semiconductor chips is often utilized to improve performance of the transistors. By arranging transistors in three dimensions instead of conventional two dimensions, multiple transistors may be placed in the integrated circuits (ICs) very close to each other. Three-dimensional stacking of semiconductor chips reduces wire lengths and keeps wiring delay low. In manufacturing three-dimensional stacking of semiconductor chips and stair-like structures are often utilized to allow multiple interconnection structures to be disposed thereon, forming a high-density of vertical transistor devices.

These three-dimensional stacks are formed in and on silicon and other semiconductor substrates. In the case of single crystal silicon (i.e., microcrystalline silicon), substrates are made by growing an ingot from a bath of molten silicon, and then sawing the solidified ingot into multiple wafers. An epitaxial silicon layer may then be formed on the monocrystalline silicon wafer to form a defect-free silicon layer that may be doped or undoped. Semiconductor devices, such as transistors, are manufactured from the epitaxial silicon layer. The electrical properties of the formed epitaxial silicon layer will generally be better than the properties of the monocrystalline silicon substrate.

Surfaces of the monocrystalline silicon and the epitaxial silicon layer are susceptible to contamination when exposed to typical wafer fabrication facility ambient conditions. For example, a native oxide layer may form on the monocrystalline silicon surface prior to deposition of the epitaxial layer. Additionally, contaminants present in the ambient environment may deposit on the monocrystalline surface. The presence of a native oxide layer or contaminants on the monocrystalline silicon surface negatively affects the quality of an epitaxial layer subsequently formed on the monocrystalline surface.

While present cleaning methods remove some of the native oxides and contaminants from the monocrystalline silicon surface, some contaminants remain. Further, as the aspect ratios of the features increase it becomes more difficult to clean silicon surfaces positioned at the bottom of high aspect ratio ("HAR") features. For example, as aspect ratios approach the range of 30:1 to 50:1, ions produced using currently available cleaning methods often stick to the sidewalls of the high aspect ratio feature and fail to reach the silicon surface at the bottom of the high aspect ratio feature.

Therefore, there is a need for a method and apparatus for cleaning a substrate surface, especially for cleaning a substrate surface prior to performing an epitaxial deposition process.

SUMMARY

Implementations of the present disclosure generally relate to methods and apparatuses for epitaxial deposition on substrate surfaces. More particularly, implementations of the present disclosure generally relate to methods and apparatuses for surface preparation prior to epitaxial deposition. In one implementation, a method of processing a substrate is provided. The method comprises etching a surface of a silicon-containing substrate by use of a plasma etch process to form an etched surface of the silicon-containing substrate and forming an epitaxial layer on the etched surface of the silicon-containing substrate. The plasma etch process comprises flowing an etchant gas mixture comprising a fluorine-containing precursor and a hydrogen-containing precursor into a substrate-processing region of a first processing chamber and forming a plasma from the etchant gas mixture flowed into the substrate-processing region.

In another implementation, a method of processing a substrate is provided. The method comprises removing oxides from a surface of a silicon-containing substrate by a reducing process, etching a surface of a silicon-containing substrate by use of an inductively coupled plasma etch process to form an etched surface of the silicon-containing substrate, and forming an epitaxial layer on the etched surface of the silicon-containing substrate. The plasma etch process comprises flowing an etchant gas mixture comprising a fluorine-containing precursor and a hydrogen-containing precursor into a substrate-processing region of a first processing chamber and forming a plasma from the etchant gas mixture flowed into the substrate-processing region.

In yet another implementation, a method of processing a substrate is provided. The method comprises removing oxides from a surface of a silicon-containing substrate by a reducing process, etching a surface of a silicon-containing substrate by use of an inductively coupled plasma etch process to form an etched surface of the silicon-containing substrate, and forming an epitaxial layer on the etched surface of the silicon-containing substrate. The plasma etch process comprises flowing an etchant gas mixture comprising a nitrogen trifluoride ($NF_3$) precursor and an ammonia precursor into a substrate-processing region of a first processing chamber and forming an inductively coupled plasma from the etchant gas mixture flowed into the substrate-processing region.

In yet another implementation, a method of processing a substrate is provided. The method comprises transferring a patterned substrate into a substrate-processing region. The patterned substrate has an exposed silicon-containing surface positioned at a bottom of a high aspect ratio feature having a depth more than ten times a width of the high aspect ratio feature. The method comprises removing oxides from the exposed silicon-containing surface by use of a first plasma etch process. The first plasma etch process further comprises flowing a fluorine-containing precursor and an inert gas into the substrate processing region while applying a plasma power to form fluorine ions and inert gas ions. The first plasma etch process further comprises etching the silicon-containing surface with the fluorine ions and the hydrogen-containing ions while applying a bias to the substrate to remove oxides form an etched silicon-containing surface. The method further comprises forming an epitaxial layer on the etched silicon-containing surface, wherein the plasma etch process and forming an epitaxial layer on the etched surface of the patterned substrate are performed without exposing the patterned substrate to atmosphere.

In yet another implementation, a method of processing a substrate is provided. The method comprises transferring a patterned substrate into a substrate-processing region. The patterned substrate has an exposed silicon-containing surface positioned at a bottom of a high aspect ratio feature having a depth more than ten times a width of the high aspect ratio feature. The method comprises removing oxides from the exposed silicon-containing surface by use of a first plasma etch process. The first plasma etch process comprises flowing nitrogen trifluoride ($NF_3$) and argon gas into the substrate processing region while applying a plasma power to form fluorine-containing ions and argon ions, wherein a flow rate of $NF_3$ and argon gas results in an argon gas-to-$NF_3$ atomic flow ratio of between 80:1 and 150:1. The first plasma etch process further comprises etching the silicon-containing surface with the fluorine ions and the argon ions while applying a bias to the substrate to form an etched silicon-containing surface. The method further comprises forming an epitaxial layer on the etched silicon-containing surface, wherein the plasma etch process and forming an epitaxial layer on the surface of the patterned substrate are performed without exposing the patterned substrate to atmosphere.

In yet another implementation, a method of processing a substrate is processing a substrate. The method comprises transferring a patterned substrate into a substrate-processing region. The patterned substrate has an exposed silicon-containing surface positioned at a bottom of a high aspect ratio feature having a depth more than ten times a width of the high aspect ratio feature. The method further comprises removing oxides from the exposed silicon-containing surface by use of a first plasma etch process. The first plasma etch process comprises flowing a fluorine-containing precursor and a heavy inert precursor into the substrate processing region while applying a plasma power to bombard the exposed silicon-containing surface with fluorine-containing ions while applying a bias to the substrate, etching the exposed silicon-containing surface by use of a second plasma etch process. The second plasma etch process comprises flowing an etching gas mixture comprising a chlorine-containing precursor and a hydrogen-containing precursor into the substrate processing region while applying a plasma power to form chlorine-containing ions and hydrogen-containing ions and etching the silicon-containing surface with the chlorine-containing ions and the hydrogen-containing ions. The method further comprises removing etchant residue from the silicon-containing surface of the patterned substrate by a third plasma etch process. The third plasma etch process comprises flowing the chlorine-containing precursor and the hydrogen-containing precursor into the substrate processing region while applying a bias to the substrate and applying the plasma power to form chlorine-containing ions and hydrogen-containing ions and etching the silicon-containing surface with the chlorine-containing ions and the hydrogen-containing ions while applying the bias to the substrate. The method further comprises forming an epitaxial layer on the etched silicon-containing surface of the patterned substrate, wherein the third plasma etch process and forming an epitaxial layer on the surface of the patterned substrate are performed without exposing the patterned substrate to atmosphere.

BRIEF DESCRIPTION OF THE DRAWINGS

So that the manner in which the above-recited features of the present disclosure can be understood in detail, a more particular description of the implementations, briefly summarized above, may be had by reference to implementations, some of which are illustrated in the appended drawings. It is to be noted, however, that the appended drawings illustrate only typical implementations of this disclosure and are therefore not to be considered limiting of its scope, for the disclosure may admit to other equally effective implementations.

Figure 1:
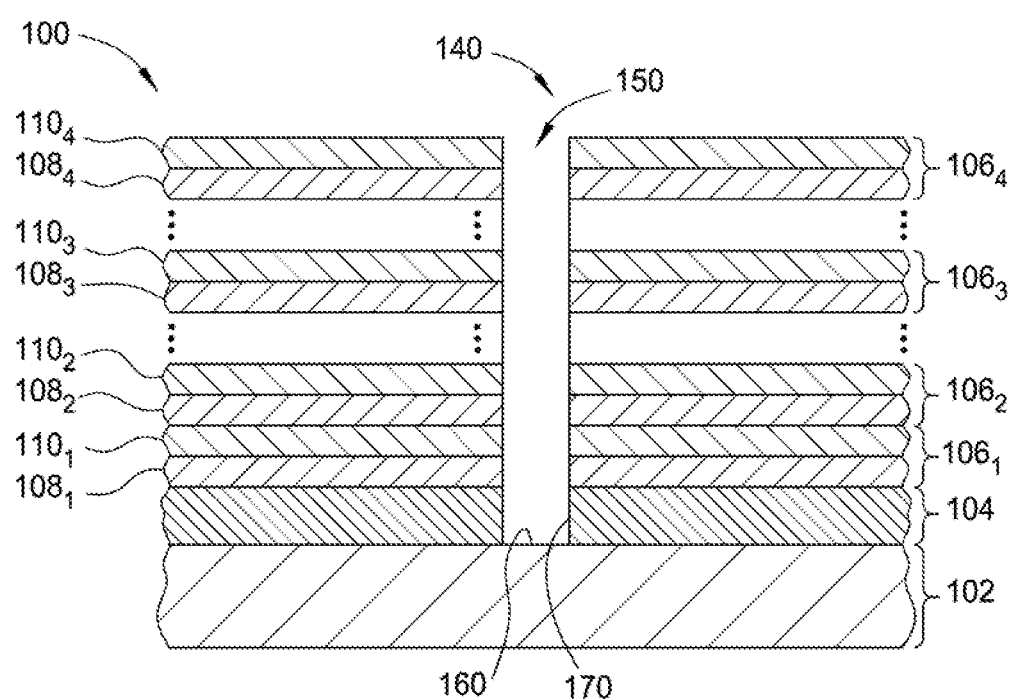
FIG. 1 depicts a cross-sectional view of a film structure having a high aspect ratio feature that may be processed according to implementations of the present disclosure.

To facilitate understanding, identical reference numerals have been used, where possible, to designate identical elements that are common to the figures. It is contemplated that elements and features of one implementation may be beneficially incorporated in other implementations without further recitation. It is to be noted, however, that the appended drawings illustrate only exemplary implementations of this disclosure and are therefore not to be considered limiting of its scope, for the disclosure may admit to other equally effective implementations.

DETAILED DESCRIPTION

The following disclosure generally describes methods and apparatuses for epitaxial deposition on substrate surfaces. Certain details are set forth in the following description and in FIGS. 1-6 to provide a thorough understanding of various implementations of the disclosure. Other details describing well-known structures and systems often associated with epitaxial deposition and surface preparation of substrates are not set forth in the following disclosure to avoid unnecessarily obscuring the description of the various implementations.

Many of the details, dimensions, angles and other features shown in the Figures are merely illustrative of particular implementations. Accordingly, other implementations can have other details, components, dimensions, angles and features without departing from the spirit or scope of the present disclosure. In addition, further implementations of the disclosure can be practiced without several of the details described below.

Continued progress in reducing the size of devices in an integrated circuit is driving a number of changes to semiconductor manufacturing processes. Among those changes is a reduction in size of components such as channels and contacts. As size is reduced, the need for high quality materials and in some cases different materials, increases. For example, in transistor channel applications, germanium is increasingly used with silicon to form the channel. High quality material is typically achieved via epitaxial deposition processes. Next generation nodes involve increasingly pristine surfaces for successful epitaxy, along with selectivity of semiconductor materials over dielectric materials. Current cleaning processes are increasingly inadequate in quality and ability to clean next generation materials.

In some implementations of the present disclosure, a method of cleaning semiconductor substrates is provided. The method includes exposing the substrate to inductively coupled plasma of, for example, $Ar/NF_3$, followed by inductively coupled plasma of $H_2/Cl_2$. The substrate is positioned on an electrostatic chuck, which is biased, during one or more operations. The first operation is used to remove mostly oxide. The second operation is used to perform a slight etch of the exposed semiconductor material to remove embedded impurities and surface irregularities. The process is selective to semiconductor materials, such as silicon and germanium, and silicon oxide over dielectric materials, such as silicon nitride.

Native oxides present on silicon-containing surfaces prior to processing and oxygen contaminants that contaminate the silicon-containing surface during processing affect the quality of subsequently deposited epitaxial layers and the final formed device. Implementations of the present disclosure provide systems and methods for reducing native oxides and oxygen contaminants present during device formation. In one implementation of the present disclosure, methods of pre-cleaning a silicon-containing substrate prior to epitaxial deposition, which results in deposition of an improved epitaxial material, are provided. It has been found by the inventors that clustering processing chambers through vacuum transfer reduces exposure to atmosphere and correspondingly reduces exposure to oxygen contaminants. For example, performing inductively coupled plasma chlorine etching of silicon prior to epitaxial deposition without exposing the substrate to atmosphere (e.g., without breaking vacuum) between etching and deposition reduces exposure to oxygen contaminants. In some implementations, a native oxide removal process (e.g., capacitively coupled plasma using $NH_3/NF_3$; inductively coupled plasma using $NH_3/NF_3$; inductively coupled plasma using $Ar/NF_3$; chemical oxide removal thermal combination of anhydrous $HF+NH_3$; or exposure to aqueous HF) is performed followed by a silicon-etching process (e.g., capacitively coupled plasma using $H_2/NF_3$; inductively coupled plasma using $H_2/NF_3$; inductively coupled plasma $H_2/Cl_2$ silicon etching); followed by an optional residue removal process and an epitaxial deposition process. Since most native oxide removal processes are unstable, native oxide starts regrowing on the silicon-containing surface upon exposure to atmosphere. Clustering the native oxide removal chamber along with the etching of silicon and epitaxial deposition also leads to a reduction in oxygen contaminants.

Implementations described herein will be described below in reference to cleaning, etching and deposition processes that can be carried out using systems available from Applied Materials, Inc. of Santa Clara, Calif. Other tools capable of performing these cleaning, etching and deposition processes may be adapted to benefit from the implementations described herein. In addition, any system enabling the cleaning, etching and deposition processes described herein can be used to advantage. The apparatus description described herein is illustrative and should not be construed or interpreted as limiting the scope of the implementations described herein.

Figure 2:
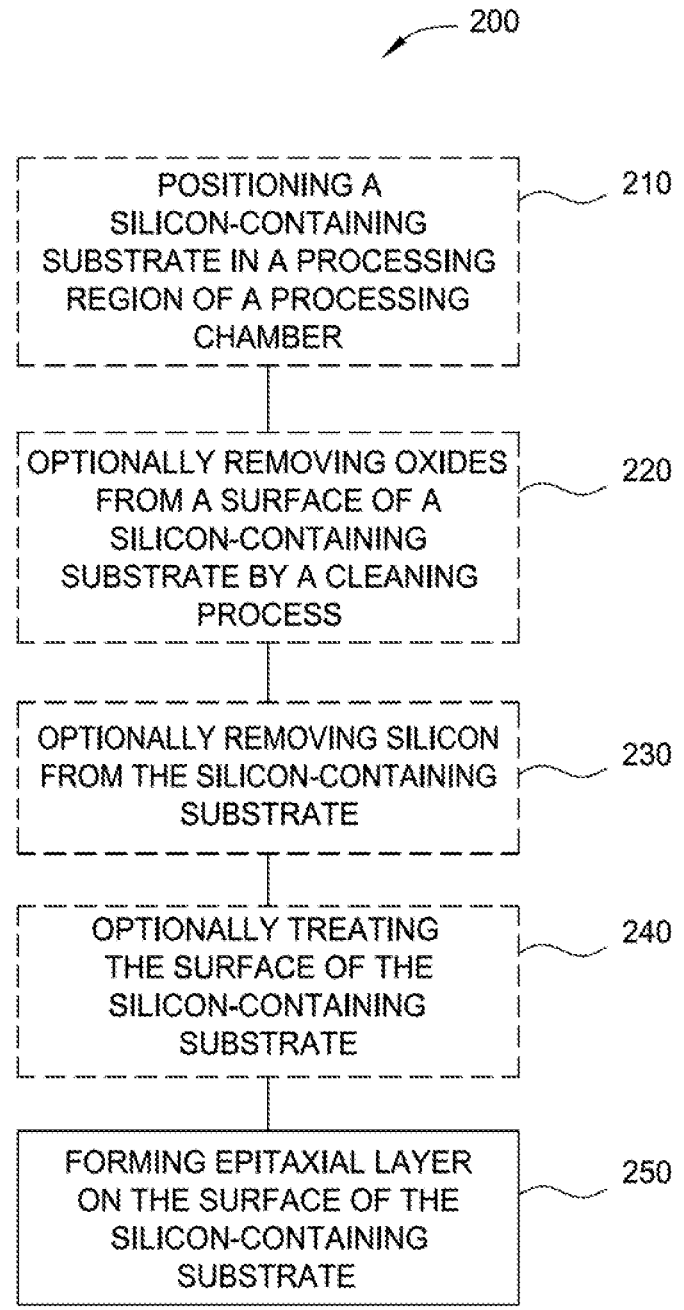
FIG. 2 is a flow chart illustrating a processing sequence in accordance with implementations of the present disclosure.
Figure 3:
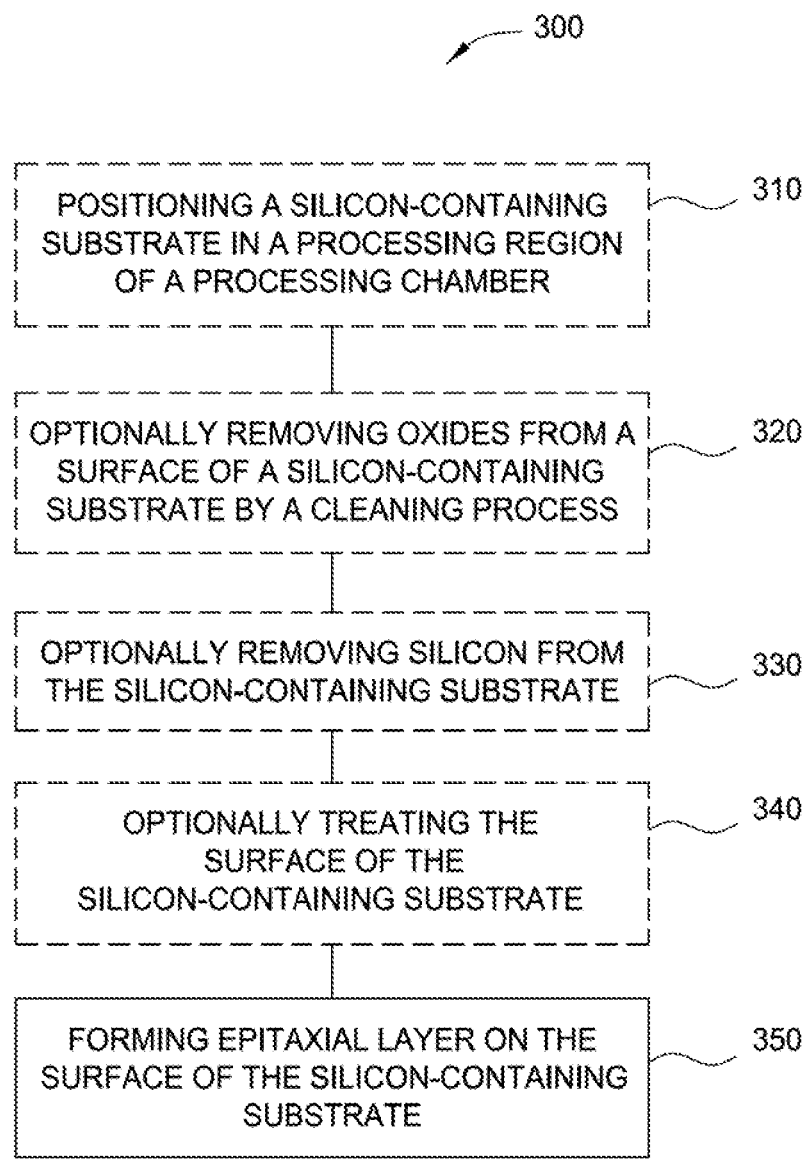
FIG. 3 is a flow chart illustrating another processing sequence in accordance with implementations of the present disclosure.

FIG. 1 depicts a cross-sectional view of a film structure 100 having a high aspect ratio feature 140 formed therein on a substrate 102 that may be processed utilizing the methods depicted in FIG. 2 and FIG. 3. Although only one high aspect ratio feature 140 is shown in FIG. 1, it should be understood that multiple high aspect ratio features may be formed in the film structure 100. In one implementation, the film structure 100 may be utilized to form gate structures for three-dimensional NAND semiconductor applications. In manufacturing three-dimensional NAND semiconductor applications, stair-like oxide-nitride pairs of structures are often utilized to form high aspect ratio gate stack NAND cells to increase circuit density.

Optionally, the film structure 100 may be formed on a base layer 104 of a substrate 102. The base layer 104 may be a patterned layer including a first material and a second material. The film structure 100 has a plurality of material layer stacks $106_1$, $106_2$, $106_3$, $106_4$ ... $106_n$ (collectively 106) formed on the base layer 104 sequentially. Each material layer stack of the plurality of material layer stacks 106 may include a first film layer $108_1$, $108_2$, $108_3$, $108_4$ ... $108_n$ (collectively 108) and a second film layer $110_1$, $110_2$, $110_3$, $110_4$ ... $110_n$ (collectively 110) formed thereon so that the film structure 100 includes a plurality of first film layers 108 and second film layers 110 formed in alternation. In one implementation the plurality of first film layers 108 are silicon oxide layers and the plurality of second film layers 110 are silicon nitride layers. The plurality of material layer stacks 106 may be formed by PECVD deposition techniques in a plasma-processing chamber.

In further implementations, the first material layer/second material layer stacks can be oxide/silicon, silicon/doped silicon, or silicon/nitride. All of these combinations of materials can be used in Bit-Cost Scalable (BiCS), Terabit Cell Array Transistor (TCAT) and other 3D memory structures. In other implementations, the first material layer and second material layer stacks can be other combinations of materials. The deposition order of the first film layers 108 and second film layers 110 on the substrate 102 can also be reversed.

The number of layers can depend upon the memory device being fabricated. In one implementation, the stack numbers could be 8×, or 16×, or 24×, or even higher, where each stack of 8, 16, 24, 32, 64, 128 or more layers corresponds to one memory device. The two layers of different materials form each stack, so the corresponding number of layers for an 8×stack number can be 16, a 16×stack number can have 32 layers, a 24×stack number can have 48 layers, and a higher stack number can have a respectively higher number of layers.

The substrate 102 shown in FIG. 1 includes the base layer 104 formed on the substrate 102. In some implementations where the base layer 104 is not present, the film structure 100 may be formed directly on the surface of the substrate 102. In one implementation, the substrate 102 may have a substantially planar surface, an uneven surface, or a substantially planar surface having a structure formed thereon. The substrate 102 may be a material such as crystalline silicon (e.g., Si<100> or Si<111>), silicon oxide, strained silicon, silicon germanium, doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate 102 may have various dimensions, such as 200 mm or 300 mm diameter wafers, as well as, rectangular or square panels. Unless otherwise noted, implementations and examples described herein are conducted on substrates having a 300 mm diameter. In one implementation, the substrate 102 may be a crystalline silicon substrate (e.g., monocrystalline silicon or polycrystalline silicon).

The high aspect ratio feature 140 may be formed using reactive ion etching techniques or other anisotropic etching techniques. In one implementation, plasma or ion beam of etch gas may be directed to the substrate 102 to form the high aspect ratio feature 140. The etch gas may include $SF_6$, $C_3F_8$ $CF_4$, $BF_3$, $BI_3$, $N_2$, Ar, $PH_3$, $AsH_3$, $B_2H_6$, $H_2$, Xe, Kr, Ne, He, $SiH_4$, $SiF_4$, $GeH_4$, $GeF_4$, $CH_4$, $AsF_5$, $PF_3$, $PF_5$, or combinations thereof. The high aspect ratio feature 140 has an opening 150. The high aspect ratio is defined by a bottom surface 160 and a sidewall 170. In some implementations, the bottom surface 160 is an exposed silicon or silicon-containing surface (e.g., monocrystalline silicon surface). In some implementations, the bottom surface 160 is an exposed germanium or germanium-containing surface. In some implementations, the bottom surface 160 is defined by an exposed surface of the substrate 102. In some implementations where the high aspect ratio feature 140 does not extend to the surface of the substrate 102, the bottom surface 160 may be defined by the material layer stacks 106 or the base layer 104, if present. The sidewall 170 is defined by the plurality of material layer stacks 106.

The high aspect ratio feature 140 may include features with high height to width aspect ratios (the ratio of the height of the bare hole divided by the width of the hole) of at least about 5:1 or more (e.g., an aspect ratio of 6:1 or more, 7:1 or more, 8:1 or more, 9:1 or more, 10:1 or more, 11:1 or more, 12:1, 16:7 or more, or about 10:1 to about 20:1, or in the range of about 30:1 to about 50:1; or in the range of about 70:1 to about 100:1). Exemplary feature definitions include vias, trenches, gaps, lines, contact-holes, through-holes or other feature definitions utilized in a semiconductor, solar, or other electronic devices, such as high ratio contact plugs.

The bottom surface 160 of the high aspect ratio feature 140 is susceptible to contamination when exposed to typical wafer fabrication facility ambient conditions. For example, a native oxide layer may form on the bottom surface 160 prior to deposition of the epitaxial layer. Additionally, contaminants present in the ambient environment may deposit on the bottom surface 160. The presence of a native oxide layer or contaminants on the bottom surface 160 negatively affects the quality of an epitaxial layer subsequently formed on the bottom surface 160. As previously discussed, ions from currently available cleaning techniques often collide with the sidewall 170 and fail to reach the bottom surface 160 of the high aspect ratio feature 140. Thus, currently available cleaning techniques fail to remove the native oxides and contaminants formed on the bottom surface 160.

FIG. 2 illustrates a processing sequence 200 in accordance with one implementation of the present disclosure. The processing sequence 200 begins at operation 210 by positioning a substrate, such as substrate 102, into a processing region of a processing chamber, such as substrate-processing region 401 of processing chamber 400 depicted in FIG. 4 or substrate-processing region 501 of the plasma-processing chamber 500 depicted in FIG. 5. The substrate may be positioned on a substrate support (e.g., substrate support 432 or substrate support 515) positioned in the processing region (e.g., substrate-processing region 401 or substrate-processing region 501).

The substrate may be a semiconductor substrate with devices formed thereon. In one implementation, the substrate may have a substantially planar surface, an uneven surface, or a substantially planar surface having a structure formed thereon. The substrate may be a material such as crystalline silicon (e.g., Si<100> or Si<111>), silicon oxide, strained silicon, silicon germanium (SiGe), doped or undoped polysilicon, doped or undoped silicon wafers and patterned or non-patterned wafers silicon on insulator (SOI), carbon doped silicon oxides, silicon nitride, doped silicon, germanium, gallium arsenide, glass, sapphire. The substrate may have various dimensions, such as 200 mm or 300 mm diameter wafers, as well as, rectangular or square panels. Unless otherwise noted, implementations and examples described herein are conducted on substrates having a 300 mm diameter. In one implementation, the substrate may be a crystalline silicon substrate (e.g., monocrystalline silicon or polycrystalline silicon). The substrate may include a silicon containing material and the surface may include a material, such as silicon (Si), germanium (Ge) or silicon germanium alloys (SiGe). In some implementations, the Si, Ge, or SiGe surface may have an oxide layer, such as native oxide layer, disposed thereon. In one implementation, the substrate is substrate 102 depicted in FIG. 1. The surface of the substrate may be the bottom surface 160 of the high aspect ratio feature 140 of film structure 100.

Optionally, at operation 220, native oxides on a surface of the substrate are removed by a cleaning process. Any suitable cleaning process that removes oxides from the substrate without significantly damaging the substrate may be used. Suitable cleaning processes include sputter etch processes, plasma-based oxide etch processes, wet etch processes, or combinations thereof. Exemplary wet etch processes include wet etch processes using hydrofluoric acid (HF) (for example, hot hydrofluoric ("HF")/$NH_3$ based processes, wet HF processes). Exemplary plasma-based oxide etch processes include $NF_3$/$NH_3$ inductively coupled plasma processes or $NF_3$/$NH_3$ capacitively coupled plasma processes. In some implementations, operation 220 is a bias-free process (i.e., RF bias is not applied to the substrate).

In one implementation, the plasma-based oxide etch process involves the simultaneous exposure of a substrate to $NF_3$ and $NH_3$ plasma by-products. The plasma-based oxide etch process may be a capacitively coupled plasma process or an inductively couple plasma process. In one implementation, the plasma-based oxide etch process is a remote plasma assisted dry etch process which involves the simultaneous exposure of a substrate to $NF_3$ and $NH_3$ plasma by-products. In one example, the plasma-based oxide etch process may be similar to or may include a SICONI® etch process that is available from Applied Materials, Inc. of Santa Clara, Calif. In some implementations that use remote plasma, excitation of the gas species allows plasma-damage-free substrate processing. The remote plasma etch can be largely conformal and selective towards silicon oxide layers, and thus does not readily etch silicon regardless of whether the silicon is amorphous, crystalline or polycrystalline. The remote plasma process will generally produce solid by-products, which grow on the surface of the substrate as substrate material is removed. The solid by-products can be subsequently removed via sublimation when the temperature of the substrate is raised. The plasma etch process results in a substrate surface having silicon-hydrogen (Si—H) bonds thereon.

In one implementation, the plasma-based oxide etch process includes introducing a flow of nitrogen trifluoride ($NF_3$) into a plasma forming region and/or substrate-processing region. Other sources of fluorine may augment or replace the nitrogen trifluoride. In general, a fluorine-containing precursor may be flowed into the processing region and the fluorine-containing precursor comprises at least one precursor selected from the group consisting of atomic fluorine, diatomic fluorine ($F_2$), bromine trifluoride ($BrF_3$), chlorine trifluoride ($ClF_3$), nitrogen trifluoride ($NF_3$), hydrogen fluoride (HF), sulfur hexafluoride ($SF_6$), and xenon difluoride ($XeF_2$). The plasma-based oxide etch process further includes introducing a flow of ammonia ($NH_3$) into the processing region where it is simultaneously excited in a plasma along with the nitrogen trifluoride.

The plasma-based oxide etch process may involve maintenance of a gas flow ratio ($NH_3:NF_3$) in order to achieve a desired etch selectivity of oxide. In one implementation, a gas flow ratio ($NH_3:NF_3$) between 1:1 and 50:1 (e.g., 1:1 to 20:1; 5:1 to 10:1) is used.

The flows of $NH_3$ and $NF_3$ may further include one or more relatively inert gases such as argon (Ar), helium (He), neon (Ne), xenon (Xe), nitrogen ($N_2$), and the like. The inert gas can be used to improve plasma stability, process uniformity and the like. Not to be bound by theory but it is believed that the inert gas is helpful, as an additive, to promote the formation of stable plasma. Process uniformity is generally increased when the inert gas is included. These additives are present in implementations throughout this specification. Flow rates and ratios of the different gases may be used to control etch rates and etch selectivity.

In certain disclosed implementations, the hydrogen-containing precursor (e.g., $NH_3$) is supplied at a flow rate of between about 25 sccm (standard cubic centimeters per minute) and 400 sccm, fluorine-containing precursor (e.g., $NF_3$) at a flow rate of between about 1 sccm and 25 sccm, He at a flow rate of between about 0 slm (standard liters per minute) and 3 slm, and Ar at a flow rate of between about 0 slm and 3 slm. One of ordinary skill in the art would recognize that other gases and/or flows may be used depending on a number of factors including processing chamber configuration, substrate size, geometry and layout of features, and the like. The hydrogen-containing precursor may be supplied at a flow rate between about 25 sccm and about 400 sccm, between about 50 sccm and about 300 sccm, between about 75 sccm and about 200 sccm or between about 90 sccm and about 150 sccm in implementations of the present disclosure. The fluorine-containing precursor (e.g., $NF_3$) may be supplied at a flow rate between about 1 sccm and about 25 sccm, between about 2 sccm and about 20 sccm, between about 4 sccm and about 15 sccm or between about 5 sccm and about 12 sccm in disclosed implementations.

The temperature of the substrate may be between about 0 degrees Celsius and about 200 degrees Celsius. In some implementations, the temperature of the substrate during the oxide removal process may be greater than or about 20 degrees Celsius, greater than or about 30 degrees Celsius, greater than or about 40 degrees Celsius, greater than or about 60 degrees Celsius, greater than or about 80 degrees Celsius or greater than or about 100 degrees Celsius. The substrate temperatures may be less than or about 120 degrees Celsius, less than or about 100 degrees Celsius, less than or about 80 degrees Celsius, less than or about 50 degrees Celsius, and may be between about 30 degrees Celsius and about 50 degrees Celsius in disclosed implementations.

In some implementations, energy is applied to the hydrogen-containing precursor and the fluorine-containing precursor while they are in the remote plasma region or the processing region to generate the plasma effluents. As would be appreciated by one of ordinary skill in the art, the plasma may include a number of charged and neutral species including radicals and ions. The plasma may be generated using known techniques (e.g., radio frequency excitations, capacitively coupled power, inductively coupled power, and the like). The plasma source power may be between about 10 watts and about 3000 watts (e.g., between about 10 watts and about 1,000 watts; between about 200 watts and about 2500 watts; between about 300 watts and about 2000 watts; or between about 500 watts and about 1500 watts) in implementations of the present disclosure.

The pressure within the processing region may be below or about 50 Torr, below or about 30 Torr, below or about 20 Torr, below or about 10 Torr, below or about 5 Torr, or below or about 1 Torr. The pressure may be above or about 0.1 Torr, above or about 0.2 Torr, above or about 0.5 Torr or above or about 1 Torr in implementations of the present disclosure. In one implementation, the pressure during oxide removal may be between about 0.1 Torr and about 0.7 Torr. However, any of the upper limits on temperature or pressure may be combined with lower limits to form additional implementations.

In one implementation, the plasma-based oxide etch process may include an $NF_3$ flow rate within a range of about 1 sccm to about 20 sccm, such as about 5 sccm, as well as an $NH_3$ flow rate within a range of about 50 sccm to about 200 sccm, such as about 100 sccm. The plasma-based oxide etch process may be performed at a pressure of about 5 Torr, and an RF power setting of about 30 W may be utilized to ionize the $NF_3$ and the $NH_3$. By-products may then be sublimated from the surface of the substrate by annealing the substrate at a temperature of about 120 degrees Celsius or more for about 5 seconds to about 100 seconds, such as about 60 seconds. Other implementations of fluorine based cleaning involve, reacting $NH_3$ gas and $F_2$ or anhydrous HF gas in either plasma or thermal heat to etch $SiO_2$ native oxides. Examples of gas flow ratios would be 1:1 to 1:10 gas flow ratio of fluorine-containing gas to $NH_3$ gas at temperatures of 15 degrees Celsius to 130 degrees Celsius.

In another implementation, the substrate is exposed to a wet clean process. The substrate may be cleaned using a wet cleaning process in which a cleaning solution, such as a HF-last type cleaning solution, ozonated water cleaning solution, hydrofluoric acid (HF) and hydrogen peroxide ($H_2O_2$) solution, or other suitable cleaning solution. The cleaning solution may be heated.

In another implementation, a different cleaning process may be utilized to clean the substrate surface. In one implementation, plasma containing Ar and $NF_3$ is introduced into the processing chamber. In another implementation, a remote plasma containing He and $NF_3$ is introduced into a processing region through a gas distribution plate, such as a showerhead. $NH_3$ may be directly injected into the chamber via a separate gas inlet.

At operation 230, silicon is removed from the silicon-containing substrate. Any suitable process may be used to remove silicon from the silicon-containing substrate to remove embedded impurities and surface irregularities. In one implementation, the silicon is removed from the silicon-containing substrate using a silicon etching process to form an etched surface of the silicon-containing substrate. The silicon etching process may be a plasma-based silicon etching process. The plasma-based silicon etching process may be a capacitively coupled plasma process or an inductively coupled plasma process. In some implementation, operation 230 is typically a bias process (i.e., RF bias is applied to the substrate). In some implementations, operation 230 is a bias-free process. The plasma-based silicon etching process may be performed in a processing region of a processing chamber, such as the substrate-processing region 401 of the processing chamber 400 depicted in FIG. 4 or the substrate-processing region 501 of the plasma-processing processing chamber 500 depicted in FIG. 5. In one implementation, the silicon etching process may be an over-etching process to enhance the surface of the substrate.

During the plasma-based silicon etching process, an etching process gas is introduced into the chamber. The etching process gas may comprise one or more etch precursors. The etch precursors are delivered through precursor/gas inlets into a substrate-processing region. In some implementations, the etch precursors may be mixed prior to introduction into the substrate-processing region. In some implementations, the etch precursors may be introduced into the substrate-processing regions separately. The etch precursors may be excited by an inductively coupled plasma created by applying alternating current (AC) power to one or more inductive coils. The etch precursor includes a fluorine-containing precursor, optionally a hydrogen-containing gas, and optionally an inert gas. The fluorine-containing precursor is selected from the group consisting of: nitrogen trifluoride ($NF_3$), nitrogen pentafluoride ($NF_5$), sulfur hexafluoride ($SF_6$), xenon difluoride ($XeF_2$), carbon tetrafluoride ($CF_4$), octafluorocyclobutane ($C_4F_8$), trifluoromethane ($CHF_3$), hydrogen fluoride (HF), diatomic fluorine ($F_2$), monatomic fluorine (F), bromine trifluoride ($BrF_3$), chlorine trifluoride ($ClF_3$), and fluorine-substituted hydrocarbons, combinations thereof, or the like.

The plasma-based silicon etching process further includes introducing a flow of a hydrogen-containing precursor into the processing region where it is simultaneously excited in a plasma along with the fluorine-containing precursor. In some implementations, the hydrogen-containing precursors may comprise atomic hydrogen (H), diatomic hydrogen ($H_2$), ammonia ($NH_3$), hydrocarbons, incompletely halogen-substituted hydrocarbons, combinations thereof, or the like.

In one implementation, the plasma-based silicon etch process may involve maintenance of a gas flow ratio (hydrogen-containing precursor:fluorine-containing precursor) in order to achieve a desired etch selectivity of silicon. In one implementation, a gas flow ratio (e.g., $H_2:NF_3$) between 1:1 and 10:1 (e.g., 1:1 to 5:1; 5:1 to 10:1) is used.

The flows of the fluorine-containing precursor and the hydrogen-containing precursor may further include one or more relatively inert gases. The inert gas may include at least one of argon (Ar), helium (He), neon (Ne), xenon (Xe), nitrogen ($N_2$), and the like. In some implementations, the substrate-processing region may consist essentially of $NF_3$, hydrogen and an inert gas, $NF_3$ and hydrogen, $NF_3$ and an inert gas, or $NF_3$, hydrogen and argon. The inclusion of the term "essentially" allows for other elemental concentrations, which may be unavoidably present in a typical processing system, as well as low concentrations, which do not adversely affect the silicon etching process.

The flows of the fluorine-containing precursor and the hydrogen-containing precursor may further include one or more additional halogen containing precursors. Exemplary halogen-containing precursors include chlorine ($Cl_2$), bromine ($Br_2$), hydrogen bromide (HBr), and combinations thereof. It is believed that inclusion of the additional halogen precursor reduces or prevents the formation of etching residue, which results from the silicon etching process.

In certain disclosed implementations, the fluorine-containing gas (e.g., $NF_3$) is supplied at a flow rate of between about 1 sccm (standard cubic centimeters per minute) and 25 sccm, $H_2$ at a flow rate of between about 25 sccm and 400 sccm, He at a flow rate of between about 0 slm (standard liters per minute) and 3 slm, and Ar at a flow rate of between about 0 slm and 3 slm. One of ordinary skill in the art would recognize that other gases and/or flows may be used depending on a number of factors including processing chamber configuration, substrate size, geometry and layout of features, and the like. Generally speaking, the hydrogen-containing precursor may be supplied at a flow rate between about 25 sccm and about 400 sccm, between about 50 sccm and about 300 sccm, between about 75 sccm and about 200 sccm or between about 90 sccm and about 150 sccm in implementations described herein. The fluorine-containing precursor may be supplied at a flow rate between about 1 sccm and about 25 sccm, between about 2 sccm and about 20 sccm, between about 4 sccm and about 15 sccm or between about 5 sccm and about 12 sccm in disclosed implementations.

The temperature of the substrate may be between about 0 degrees Celsius and about 200 degrees Celsius. In some implementations, the temperature of the substrate during the oxide removal process may be greater than or about 20 degrees Celsius, greater than or about 30 degrees Celsius, greater than or about 40 degrees Celsius, greater than or about 60 degrees Celsius, greater than or about 80 degrees Celsius or greater than or about 100 degrees Celsius. The substrate temperatures may be less than or about 120 degrees Celsius, less than or about 100 degrees Celsius, less than or about 80 degrees Celsius, less than or about 50 degrees Celsius, and may be between about 30 degrees Celsius and about 50 degrees Celsius in disclosed implementations.

Operation 230 includes applying energy to the fluorine-containing precursor, the optional hydrogen-containing precursor and the optional inert gas if present to generate the radicals used to treat and etch the surfaces of the substrate. As would be appreciated by one of ordinary skill in the art, the plasma may include a number of charged and neutral species including radicals and ions. The plasma may be generated using known techniques (e.g., radio frequency excitations, capacitively coupled power, inductively coupled power, and the like). In one implementation, the energy is applied using an inductively coupled plasma power supply unit (e.g., an inner coil antenna 540, a middle coil antenna 550, and a side coil antenna 560 as depicted in FIG. 5). In another implementation, the energy is applied using a capacitively coupled plasma power unit (e.g., the first electrode 420 and the second electrode 422 depicted in FIG. 4). The plasma source power may be between about 10 watts and about 2,500 watts (e.g., between about 50 watts and about 1,000 watts, between about 50 watts and about 500 watts; between about 100 watts and about 400 watts, or between about 200 watts and about 300 watts).

The RF frequency applied for either the local or remote plasmas described herein may be low RF frequencies less than about 200 kHz, high RF frequencies between about 10 MHz and about 15 MHz (e.g., 13.56 MHz), or microwave frequencies greater than or about 1 GHz.

In some implementation, during operation 230, an RF bias is applied to the substrate via the substrate support with an RF power supply. Power applied to the substrate support creates a substrate bias in the form of a negative voltage on the upper surface of the substrate. This negative voltage is used to attract ions from the plasma formed in the substrate-processing region to the upper surface of the substrate. The RF bias may have a power level within a range from about 50 W to about 800 W. In one implementation, the RF bias may have a power level within a range from about 200 W to 400 W. For example, the RF bias may have a power level of 100 W, 200 W, 300 W, or 400 W. In some implementations, the frequency of the RF bias will be less than the frequency of the RF power source coupled to the coils of the chamber. For example, in some implementations, the RF bias frequency may be 2 MHz while the RF power source frequency may be 13.56 MHz. In another implementation, the RF bias frequency may be about 13.56 MHz and the RF power source frequency may be about 60 MHz. For example, the substrate is positioned on substrate support surface 521 and bias is applied to the substrate by insulated internal electrode 524. Not to be bound by theory but it is believed that application of bias to the substrate accelerates ions toward the substrate surface and achieves improved oxide removal from the substrate surface.

In some implementations, during operation 230, the power used to generate the RF bias may be pulsed. Power may be applied to the power source for a desired time, and then discontinued for a desired time. Power cycling may be repeated for a desired number of cycles at a desired frequency and duty cycle. In some implementations, the RF bias may be pulsed at a frequency between about 1 Hz and about 50,000 Hz, such as between about 5,000 Hz and about 10,000 Hz. In other implementations, the RF bias pulsing may proceed with a duty cycle, (ratio of powered time to unpowered time per cycle) between about 5% and about 40%, such as between about 15% and about 20%.

The pressure within the substrate-processing region may be below or about 10 Torr, below or about 5 Torr, below or about 1 Torr, below or about 0.7 Torr, below or about 0.5 Torr, or below or about 0.1 Torr. The pressure may be above or about 0.5 mTorr, above or about 0.01 Torr, about 0.1 Torr, above or about 0.5 Torr, above or about 0.7 Torr or above or about 1 Torr in implementations of the present disclosure. In some implementations, the pressure in the substrate-processing region may be between about 0.5 mTorr and about 700 mTorr (e.g., between about 2 mTorr and about 200 mTorr or between about 5 mTorr and about 100 mTorr; or between about 10 mTorr and about 50 mTorr).

In one implementation, the volumetric concentration of the fluorine-containing gas (e.g., $NF_3$) in the etching gas may be less than about 10%, or, more specifically less than about 5%, or even less than about 1%. In certain implementations, the volumetric concentration of the fluorine-containing gas is between about 1% and about 10%.

In one implementation, the volumetric concentration of the hydrogen-containing gas (e.g., $H_2$) in the etching gas may be less than about 10%, or, more specifically less than about 5%, or even less than about 1%. In certain implementations, the volumetric concentration of chlorine is between about 1% and about 10%.

In one implementation, the fluorine-containing precursor is $NF_3$, the hydrogen-containing gas is hydrogen, and the optional inert gas is argon, helium, or both.

Optionally, at operation 240, the etched silicon-containing substrate is exposed to a surface treatment process. Not to be bound by theory but it is believed that the treatment process repairs and/or removes bonds, which were damaged during the silicon etching process of operation 230. In one implementation, operation 240 is a bias-free process (i.e., RF bias is not applied to the substrate). The damage repaired during the surface treatment process of operation 240 may include damage and/or residue produced by etching during operation 230. Any suitable process may be used to repair and/or remove damaged bonds from the etched silicon-containing substrate. The surface treatment process of operation 240 may be similar to the oxide removal process of operation 220. The process conditions of operation 220 may be adjusted to achieve a desired etch target and used for operation 240. In one implementation, the residue is removed from the silicon-containing substrate using a residue removal process. The residue removal process may be a plasma-based etching process. The plasma-based etching process may be a capacitively coupled plasma process or an inductively coupled plasma process.

Suitable repair and/or residue removal processes include sputter etch processes, plasma etch processes, wet etch processes, or combinations thereof. Exemplary wet etch processes include wet etch processes using hydrofluoric acid (HF). Exemplary cleaning processes include $NF_3/NH_3$ plasma-based processes, hot hydrofluoric ("HF")/$NH_3$ based processes, wet HF processes, or $NF_3/NH_3$ inductively coupled plasma processes.

In one implementation, the repair and/or residue removal process involves the simultaneous exposure of a substrate to $NF_3$ and $NH_3$ plasma by-products. The plasma etch process may be a capacitively coupled plasma process or an inductively coupled plasma process. In one implementation, the repair and/or residue removal process is a remote plasma assisted dry etch process, which involves the simultaneous exposure of a substrate to $NF_3$ and $NH_3$ plasma by-products. In one example, the repair and/or residue removal process may be similar to or may include a SICONI® etch process that is available from Applied Materials, Inc. of Santa Clara, Calif. In some configurations that use remote plasma, excitation of the gas species allows plasma-damage-free substrate processing. The remote plasma etch can be largely conformal and selective towards silicon oxide layers, and thus does not readily etch silicon regardless of whether the silicon is amorphous, crystalline or polycrystalline. The remote plasma process will generally produce solid by-products, which grow on the surface of the substrate as substrate material is removed. The solid by-products can be subsequently removed via sublimation when the temperature of the substrate is raised. The plasma etch process results in a substrate surface having silicon-hydrogen (Si—H) bonds thereon.

In one implementation, a repair and/or residue removal process may include an $NF_3$ flow rate within a range of about 1 sccm to about 20 sccm, such as about 5 sccm, as well as an $NH_3$ flow rate within a range of about 50 sccm to about 200 sccm, such as about 100 sccm. The residue removal process may be performed at a pressure of about 5 Torr, and an RF power setting of about 30 W may be utilized to ionize the $NF_3$ and the $NH_3$. By-products may then be sublimated from the surface of the substrate by annealing the substrate at a temperature of about 120 degrees Celsius or more for about 5 seconds to about 100 seconds, such as about 60 seconds. Other implementations of fluorine based cleaning involve, reacting $NH_3$ gas and $F_2$ or anhydrous HF gas in either plasma or thermal heat to etch $SiO_2$ native oxides. Examples of gas flow ratios would be 1:1 to 1:10 gas flow ratio of fluorine gas to $NH_3$ gas at temperatures of 15 degrees Celsius to 130 degrees Celsius.

Next, at operation 250, an epitaxial layer is deposited on the surface of the silicon-containing substrate. The surface of the substrate may be an etched surface. The surface of the substrate is contaminant free, which improves the quality of the epitaxial layer subsequently formed on the surface of the substrate. In one example, the epitaxial deposition may be a selective epitaxial deposition process performed at a temperature that is less than 800 degrees Celsius. In this example, the temperature is set such that it will not exceed 800 degrees Celsius, in order to limit the wafer thermal budget for delicate features that may distort or diffuse if overheated. In one implementation, the epitaxial layer is deposited using a high temperature chemical vapor deposition (CVD) process. In this thermal CVD process, processing gases such as dichlorosilane, silane, disilane, germane, hydrogen chloride, or combinations thereof are used to deposit the epitaxial layer. The processing temperature is less than 800 degrees Celsius and the processing pressure is between 5 and 600 Torr. In some implementations, operations 220, 230, 240, and 250 are performed without exposing the substrate to atmosphere (e.g., without breaking vacuum). When operations 220, 230, 240, and 250 are performed, contaminants at interfaces have been reduced and the epitaxial layer formed is relatively defect-free.

In one example of processing sequence 200, the clean process (operation 220) is performed in a capacitively coupled plasma-processing chamber (e.g., processing chamber 400; or the SICONI® cleaning chamber, available from Applied Materials, Inc. of Santa Clara, Calif.). The silicon etching process (operation 230) is performed in either the capacitively coupled plasma-processing chamber (e.g., processing chamber 400) or an inductively coupled plasma-processing chamber (e.g., plasma-processing chamber 500). The residue removal process is performed in either the capacitively coupled plasma-processing chamber (e.g., processing chamber 400) or an inductively coupled plasma-processing chamber (e.g., plasma-processing chamber 500). In one implementation, both operations 220 and 230 are performed in a single processing chamber, such as one of the chambers shown in FIGS. 3-4. In one implementation, both operations 220 and 230 are performed in a SICONI® cleaning chamber. Chambers available from other manufacturers may also be used to practice implementations described herein.

FIG. 3 illustrates a processing sequence 300 in accordance with one implementation of the present disclosure. The processing sequence 300 begins at operation 310 by positioning a substrate, such as substrate 102, into a processing region of a processing chamber, such as the substrate-processing region 401 of processing chamber 400 depicted in FIG. 4 or the substrate-processing region 501 of plasma-processing chamber 500 depicted in FIG. 5. The substrate may be positioned on a substrate support (e.g., substrate support 432 or substrate support 515) positioned in the processing region (e.g., substrate-processing region 401 or substrate-processing region 501).

Optionally, at operation 320, an oxide removal or "oxide breakthrough" process is performed. In operation 320, native oxides on a surface of a substrate are removed by a cleaning process. Any suitable cleaning process that removes oxides from the substrate without significantly damaging the substrate may be used. Suitable cleaning processes include sputter etch processes, plasma-based oxide etch processes, or combinations thereof. Exemplary plasma-based oxide etch processes include inductively coupled plasma processes. In one implementation, the cleaning process is a plasma-based oxide etch process. In one implementation, the plasma-based oxide etch process is an inductively coupled plasma process.

In one implementation, the plasma-based oxide etch process involves the simultaneous exposure of a substrate to the plasma effluents of a fluorine-containing precursor and an inert gas while applying a bias to the substrate. The inert gas may be a heavy inert gas. The plasma-based oxide etch process may be a capacitively coupled plasma process or an inductively couple plasma process. The plasma may be formed either in-situ or remotely.

In one implementation, the plasma-based oxide etch process includes introducing a flow of nitrogen trifluoride ($NF_3$) into a substrate-processing region. Other sources of fluorine may augment or replace the nitrogen trifluoride. In general, a fluorine-containing precursor may be flowed into the substrate-processing region and the fluorine-containing precursor comprises at least one precursor selected from the group consisting of diatomic fluorine ($F_2$), monatomic fluorine (F), nitrogen trifluoride ($NF_3$), nitrogen pentafluoride ($NF_5$), sulfur hexafluoride ($SF_6$), xenon difluoride ($XeF_2$), carbon tetrafluoride ($CF_4$), octafluorocyclobutane ($C_4F_8$), trifluoromethane ($CHF_3$), hydrogen fluoride (HF), and combinations thereof.

The plasma-based oxide etch process further includes introducing a flow of an inert gas into the substrate-processing region where it is simultaneously excited in a plasma along with the nitrogen trifluoride. The inert gas may be selected from the group of inert gases including helium (He), argon (Ar), krypton (Kr), xenon (Xe), and combinations thereof. The inert gas may be a heavy inert gas. As described herein, heavy inert gases include argon (Ar), krypton (Kr), xenon (Xe), and combinations thereof. Not to be bound by theory but it is believed that use of a heavy inert gas provides a higher ion density drawing the fluorine ions toward the bottom surface 160 of the high aspect ratio feature 140. It is believed that this higher ion density results in more efficient oxide removal.

The precursors are typically delivered through precursor/gas inlets into a substrate-processing region. In some implementations, the gases may be mixed prior to introduction into the substrate-processing region. In some implementations, the gases may be introduced into the substrate-processing region separately.

The plasma-based oxide etch process may involve maintenance of a gas flow ratio (inert gas:fluorine-containing precursor) in order to achieve a desired etch selectivity of oxide. In one implementation, a gas flow ratio ($Ar:NF_3$) between 80:1 and 150:1 (e.g., 80:1 to 100:1; 110:1 to 130:1; 120:1) is used. Flow rates and ratios of the different gases may be adjusted to control etch rates and etch selectivity.

In certain disclosed implementations, the fluorine-containing precursor (e.g., $NF_3$) is supplied at a flow rate of between about 1 sccm and 25 sccm and the inert gas (e.g., Ar) is supplied at a flow rate of between about 0 slm (standard liter per minute) and 4 slm. One of ordinary skill in the art would recognize that other gases and/or flows may be used depending on a number of factors including processing chamber configuration, substrate size, geometry and layout of features, and the like. The fluorine-containing precursor (e.g., $NF_3$) may be supplied at a flow rate between about 1 sccm and about 25 sccm, between about 2 sccm and about 20 sccm, between about 4 sccm and about 15 sccm or between about 5 sccm and about 12 sccm in disclosed implementations. The inert gas (e.g., Ar) may be supplied at a flow between about 1 slm and about 3 slm; between about 1 slm and about 2 slm; or between about 2 slm and 3 slm.

In one implementation, the volumetric concentration of the fluorine-containing precursor (e.g., $NF_3$) in the inert gas/fluorine-containing precursor mixture may be less than about 10%, or, more specifically less than about 5%, or even less than about 1%. In certain implementations, the volumetric concentration of the fluorine-containing precursor is between about 0.1% and about 10% (e.g., between about 0.1% and about 1%; or between about 1% and about 5%).

In one implementation, the volumetric concentration of the inert gas (e.g., Ar) in the inert gas/fluorine-containing precursor mixture may be greater than about 90%, or, more specifically greater than about 95%, or even greater than about 99%. In certain implementations, the volumetric concentration of the inert gas is between about 90% and about 99.9% (e.g., between about 90% and about 95%; or between about 95% and about 99.9%).

During operation 320, the temperature of the substrate may be between about 0 degrees Celsius and about 200 degrees Celsius. In some implementations, the temperature of the substrate during the oxide removal process may be greater than or about 20 degrees Celsius, greater than or about 30 degrees Celsius, greater than or about 40 degrees Celsius, greater than or about 60 degrees Celsius, greater than or about 80 degrees Celsius or greater than or about 100 degrees Celsius. The substrate temperatures may be less than or about 120 degrees Celsius, less than or about 100 degrees Celsius, less than or about 80 degrees Celsius, less than or about 50 degrees Celsius, and may be between about 30 degrees Celsius and about 50 degrees Celsius in disclosed implementations.

Operation 320 also includes applying energy to the inert gas and the fluorine-containing precursor while they are in the remote plasma region or the substrate-processing region to generate the plasma effluents. As would be appreciated by one of ordinary skill in the art, the plasma may include a number of charged and neutral species including radicals and ions. The plasma may be generated using known techniques (e.g., radio frequency excitations, capacitively coupled power, inductively coupled power, and the like). The plasma source power may be between about 10 watts and about 3,000 watts (e.g., between about 10 watts and about 1,000 watts; between about 200 watts and about 2,500 watts; between about 300 watts and about 2,000 watts; or between about 500 watts and about 1,500 watts) in implementations of the present disclosure.

During operation 320, the pressure within the substrate-processing region may be below or about 10 Torr, below or about 5 Torr, below or about 1 Torr, below or about 0.7 Torr, below or about 0.5 Torr, or below or about 0.1 Torr. The pressure may be above or about 0.5 mTorr, above or about 0.01 Torr, about 0.1 Torr, above or about 0.5 Torr, above or about 0.7 Torr or above or about 1 Torr in implementations of the present disclosure. In some implementations, the pressure in the substrate-processing region may be between about 0.5 mTorr and about 700 mTorr (e.g., between about 2 mTorr and about 200 mTorr; or between about 5 mTorr and about 100 mTorr; or between about 10 mTorr and about 50 mTorr; or between about 5 mTorr and about 80 mTorr).

During operation 320, an RF bias is applied to the substrate via the substrate support with an RF power supply. Power applied to the substrate support creates a substrate bias in the form of a negative voltage on the upper surface of the substrate. This negative voltage is used to attract ions from the plasma formed in the substrate-processing region to the upper surface of the substrate. The RF bias may have a power level within a range from about 50 W to about 800 W. In one implementation, the RF bias may have a power level within a range from about 200 W to 400 W. For example, the RF bias may have a power level of 100 W, 200 W, 300 W, or 400 W. In some implementations, the frequency of the RF bias will be less than the frequency of the RF power source coupled to the coils of the chamber. For example, in some implementations, the RF bias frequency may be 2 MHz while the RF power source frequency may be 13.56 MHz. In another implementation, the RF bias frequency may be about 13.56 MHz and the RF power source frequency may be about 60 MHz. For example, the substrate is positioned on substrate support surface 521 and bias is applied to the substrate by insulated internal electrode 524. Not to be bound by theory but it is believed that application of bias to the substrate accelerates ions toward the substrate surface and achieves improved oxide removal from the substrate surface.

In some implementations, the power used to generate the RF bias may be pulsed. Power may be applied to the power source for a desired time, and then discontinued for a desired time. Power cycling may be repeated for a desired number of cycles at a desired frequency and duty cycle. In some implementations, the RF bias may be pulsed at a frequency between about 1 Hz and about 50,000 Hz, such as between about 5,000 Hz and about 10,000 Hz. In other implementations, the RF bias pulsing may proceed with a duty cycle (ratio of powered time to unpowered time per cycle) between about 5% and about 40%, such as between about 15% and about 20%.

At operation 330, exposed silicon-containing material is removed from the silicon-containing substrate to remove embedded impurities and surface irregularities. In one implementation, about 15 nanometers to about 25 nanometers of silicon material is removed from the surface of the silicon-containing substrate. Operation 330 is typically a bias process (i.e., RF bias is applied to the substrate). Any suitable process may be used to remove silicon from the silicon-containing substrate. In one implementation, the silicon is removed from the silicon-containing substrate using a silicon etching process. The silicon etching process may be a plasma-based silicon etching process. The plasma-based silicon etching process may be a capacitively coupled plasma process or an inductively coupled plasma process. In one implementation, the plasma-based silicon etching process further includes applying a bias to the substrate. Not to be bound by theory but it is believed that the plasma-based silicon etching process removes silicon-containing material that has suffered lattice damage caused by the oxide removal process of operation 320.

In one implementation, the plasma-based silicon etching process involves the simultaneous exposure of a substrate to the plasma effluents of a chlorine-containing precursor and a hydrogen-containing precursor while applying a bias to the substrate.

During the plasma-based silicon etching process, an etching process gas is introduced into a substrate-processing region of a processing chamber. The etching process gas may comprise one or more etch precursors. The etch precursors are delivered through precursor/gas inlets into a substrate-processing region. In some implementations, the etch precursors may be mixed prior to introduction into the substrate-processing region. In some implementations, the etch precursors may be introduced into the substrate-processing regions separately. The etch precursors may be excited by an inductively coupled plasma created by applying alternating current (AC) power to one or more inductive coils (e.g., the inner coil antenna 540, the middle coil antenna 550, and the side coil antenna 560 as depicted in FIG. 5). The etch precursor includes a chlorine-containing precursor, a hydrogen-containing precursor, and optionally an inert precursor. The chlorine-containing precursor is typically chlorine gas ($Cl_2$).

The plasma-based silicon etching process further includes introducing a flow of a hydrogen-containing precursor into the substrate-processing region where it is simultaneously excited in plasma along with the chlorine-containing precursor. In some implementations, the hydrogen-containing precursors may comprise atomic hydrogen (H), diatomic hydrogen ($H_2$), ammonia ($NH_3$), hydrocarbons, incompletely halogen-substituted hydrocarbons, combinations thereof, or the like.

In one implementation, the plasma-based silicon etch process may involve maintenance of a gas flow ratio (hydrogen-containing precursor:chlorine-containing precursor) in order to achieve a desired etch selectivity of silicon. In one implementation, a gas flow ratio (e.g., $H_2:Cl_2$) between 1:1 and 10:1 (e.g., 1:1 to 5:1; 5:1 to 10:1) is used.

The flows of the chlorine-containing precursor and the hydrogen-containing precursor may further include one or more relatively inert gases. The inert precursor may include at least one of argon (Ar), helium (He), neon (Ne), xenon (Xe), nitrogen ($N_2$), and the like. In some implementations, the substrate-processing region may consist essentially of $Cl_2$, hydrogen and an inert gas, $Cl_2$ and hydrogen, $Cl_2$ and an inert gas, or $Cl_2$, hydrogen and argon. The inclusion of the term "essentially" allows for other elemental concentrations, which may be unavoidably present in a typical processing system, as well as low concentrations, which do not adversely affect the silicon etching process.

In certain disclosed implementations, the chlorine-containing precursor (e.g., $Cl_2$) is supplied at a flow rate of between about 1 sccm (standard cubic centimeters per minute) and 25 sccm, the hydrogen-containing precursor ($H_2$) at a flow rate of between about 25 sccm and 400 sccm, and Ar at a flow rate of between about 0 slm (standard liters per minute) and 3 slm. One of ordinary skill in the art would recognize that other gases and/or flows may be used depending on a number of factors including processing chamber configuration, substrate size, geometry and layout of features, and the like. The hydrogen-containing precursor may be supplied at a flow rate between about 25 sccm and about 400 sccm, between about 50 sccm and about 300 sccm, between about 75 sccm and about 200 sccm or between about 90 sccm and about 150 sccm in implementations of the present disclosure. The chlorine-containing precursor may be supplied at a flow rate between about 1 sccm and about 25 sccm, between about 2 sccm and about 20 sccm, between about 4 sccm and about 15 sccm or between about 5 sccm and about 12 sccm in disclosed implementations.

During operation 330, the temperature of the substrate may be between about 0 degrees Celsius and about 200 degrees Celsius. In some implementations, the temperature of the substrate during the silicon removal process may be greater than or about 20 degrees Celsius, greater than or about 30 degrees Celsius, greater than or about 40 degrees Celsius, greater than or about 60 degrees Celsius, greater than or about 80 degrees Celsius or greater than or about 100 degrees Celsius. The substrate temperatures may be less than or about 120 degrees Celsius, less than or about 100 degrees Celsius, less than or about 80 degrees Celsius, less than or about 50 degrees Celsius, and may be between about 30 degrees Celsius and about 50 degrees Celsius in disclosed implementations.

Operation 330 includes applying energy to the chlorine-containing precursor, the hydrogen-containing precursor and the optional inert gas if present to generate the radicals used to treat and etch the surfaces of the substrate. As would be appreciated by one of ordinary skill in the art, the plasma may include a number of charged and neutral species including radicals and ions. The plasma may be generated using known techniques (e.g., radio frequency excitations, capacitively coupled power, inductively coupled power, and the like). In one implementation, the energy is applied using an inductively coupled plasma power supply unit. In one implementation, the power is supplied to the inductive coils shown in cross-section in FIG. 3. The plasma source power may be between about 10 watts and about 2,500 watts (e.g., between about 50 watts and about 1,000 watts, between about 50 watts and about 500 watts; between about 100 watts and about 400 watts, or between about 200 watts and about 300 watts).

The RF frequency applied for either the local or remote plasmas described herein may be low RF frequencies less than about 200 kHz, high RF frequencies between about 10 MHz and about 15 MHz, or microwave frequencies greater than or about 1 GHz in implementations.

During operation 330, an RF bias is applied to the substrate via the substrate support with an RF power supply. Power applied to the substrate support creates a substrate bias in the form of a negative voltage on the upper surface of the substrate. This negative voltage is used to attract ions from the plasma formed in the substrate-processing region to the upper surface of the substrate. The RF bias may have a power level within a range from about 50 W to about 800 W. In one implementation, the RF bias may have a power level within a range from about 200 W to 400 W. For example, the RF bias may have a power level of 100 W, 200 W, 300 W, or 400 W. In some implementations, the frequency of the RF bias will be less than the frequency of the RF power source coupled to the coils of the chamber. For example, in some implementations, the RF bias frequency may be 2 MHz while the RF power source frequency may be 13.56 MHz. In another implementation, the RF bias frequency may be about 13.56 MHz and the RF power source frequency may be about 60 MHz. For example, the substrate is positioned on substrate support surface 521 and bias is applied to the substrate by insulated internal electrode 524. Not to be bound by theory but it is believed that application of bias to the substrate accelerates ions toward the substrate surface and achieves improved oxide removal from the substrate surface.

In some implementations, the power used to generate the RF bias may be pulsed. Power may be applied to the power source for a desired time, and then discontinued for a desired time. Power cycling may be repeated for a desired number of cycles at a desired frequency and duty cycle. In some implementations, the RF bias may be pulsed at a frequency between about 1 Hz and about 50,000 Hz, such as between about 5,000 Hz and about 10,000 Hz. In other implementations, the RF bias pulsing may proceed with a duty cycle (ratio of powered time to unpowered time per cycle) between about 5% and about 40%, such as between about 15% and about 20%.

During operation 330, the pressure within the substrate-processing region may be below or about 10 Torr, below or about 5 Torr, below or about 1 Torr, below or about 0.7 Torr, below or about 0.5 Torr, or below or about 0.1 Torr. The pressure may be above or about 0.5 mTorr, above or about 0.01 Torr, about 0.1 Torr, above or about 0.5 Torr, above or about 0.7 Torr or above or about 1 Torr in implementations of the present disclosure. In some implementations, the pressure in the substrate-processing region may be between about 0.5 mTorr and about 700 mTorr (e.g., between about 2 mTorr and about 200 mTorr; or between about 5 mTorr and about 100 mTorr; or between about 10 mTorr and about 50 mTorr; or between about 5 mTorr and about 80 mTorr).

In one implementation, the volumetric concentration of the chlorine-containing precursor (e.g., $Cl_2$) in the etching gas may be less than about 10%, or, more specifically less than about 5%, or even less than about 1%. In certain implementations, the volumetric concentration of the fluorine-containing precursor is between about 1% and about 10%.

In one implementation, the volumetric concentration of the hydrogen-containing precursor (e.g., $H_2$) in the etching gas may be greater than about 90%, or, more specifically greater than about 95%, or even greater than about 99%. In certain implementations, the volumetric concentration of chlorine is between about 90% and about 99%.

In one implementation, the chlorine-containing precursor is $Cl_2$, the hydrogen-containing precursor is hydrogen, and the optional inert precursor is argon, helium, or both.

Optionally, at operation 340, the etched silicon-containing substrate is exposed to a treatment process. Not to be bound by theory but it is believed that the treatment process repairs and/or removes bonds, which were damaged during the silicon etching process of operation 330. Operation 340 is typically a bias-free process (i.e., RF bias is not applied to the substrate). The damage repaired during the treatment process of operation 340 may include damage produced by etching during operation 330, the oxide removal process of operation 320, or both. Any suitable process may be used to repair and/or remove damaged bonds from the etched silicon-containing substrate. The surface treatment process of operation 340 may be similar to the etching process of operation 330 except that bias is not applied to the substrate during operation 340. The surface treatment process of operation 340 may be performed using the gases and process conditions described in operation 340. In one implementation, the flows of the chlorine-containing precursor and the hydrogen-containing precursor from operation 330 are continued and RF bias that is applied to the substrate during operation 330 is turned off during operation 340.

Other suitable surface treatment processes that may be performed during operation 340 include sputter etch processes, plasma etch processes, wet etch processes, or combinations thereof. Exemplary wet etch processes include wet etch processes using hydrofluoric acid (HF). Exemplary cleaning processes include $NF_3/NH_3$ plasma-based processes, hot hydrofluoric ("HF")/$NH_3$ based processes, wet HF processes, or $NF_3/NH_3$ inductively coupled plasma processes.

Any of operations 320, 330, or 340 may be repeated until the desired surface preparation prior to epitaxial deposition is achieved.

Next, at operation 350, an epitaxial layer is deposited on the surface of the substrate. Any suitable epitaxial deposition process may be used. The surface of the substrate is contaminant free, which improves the quality of the epitaxial layer subsequently formed on the surface of the substrate. In one example, the epitaxial deposition may be a selective epitaxial deposition process performed at a temperature that is less than 800 degrees Celsius. In this example, the temperature is set such that it will not exceed 800 degrees Celsius, in order to limit the wafer thermal budget for delicate features that may distort or diffuse if overheated. In one implementation, the epitaxial layer is deposited using a high temperature chemical vapor deposition (CVD) process. In this thermal-CVD process, processing gases such as dichlorosilane, silane, disilane, germane, hydrogen chloride, or combinations thereof are used to deposit the epitaxial layer. The processing temperature is less than 800 degrees Celsius and the processing pressure is between 5 and 600 Torr. When operations 320, 330, 340 and 350 are performed without exposing the substrate to atmosphere, contaminants at interfaces have been reduced and the epitaxial layer formed is relatively defect-free.

In one example of processing sequence 300, the clean process (operation 320) is performed in an inductively coupled plasma-processing chamber (e.g., plasma-processing chamber 500). The silicon etching process (operation 330) is performed in either the capacitively coupled plasma-processing chamber (e.g., processing chamber 400) or the inductively coupled plasma-processing chamber (e.g., plasma-processing chamber 500). The surface treatment process (operation 340) is performed in either the capacitively coupled plasma-processing chamber (e.g., processing chamber 400) or the inductively coupled plasma-processing chamber (e.g., plasma-processing chamber 500). In one implementation, operations 320, 330 and 340 are performed in a single processing chamber, such as one of the chambers shown in FIGS. 4-5.

Figure 4:
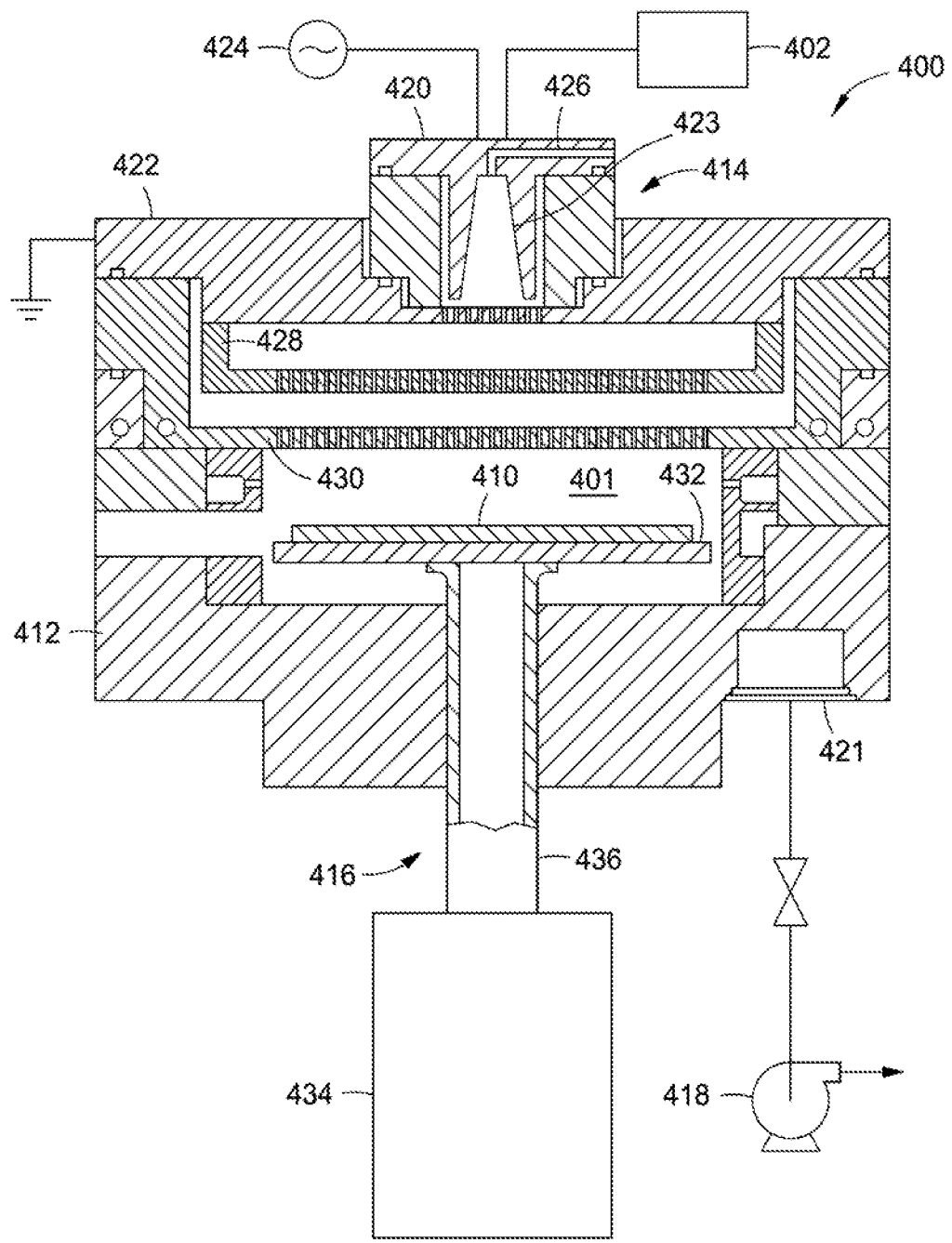
FIG. 4 is a cross sectional view of a cleaning chamber that may be used to perform the processing sequences described herein according to implementations described herein.
Figure 5:
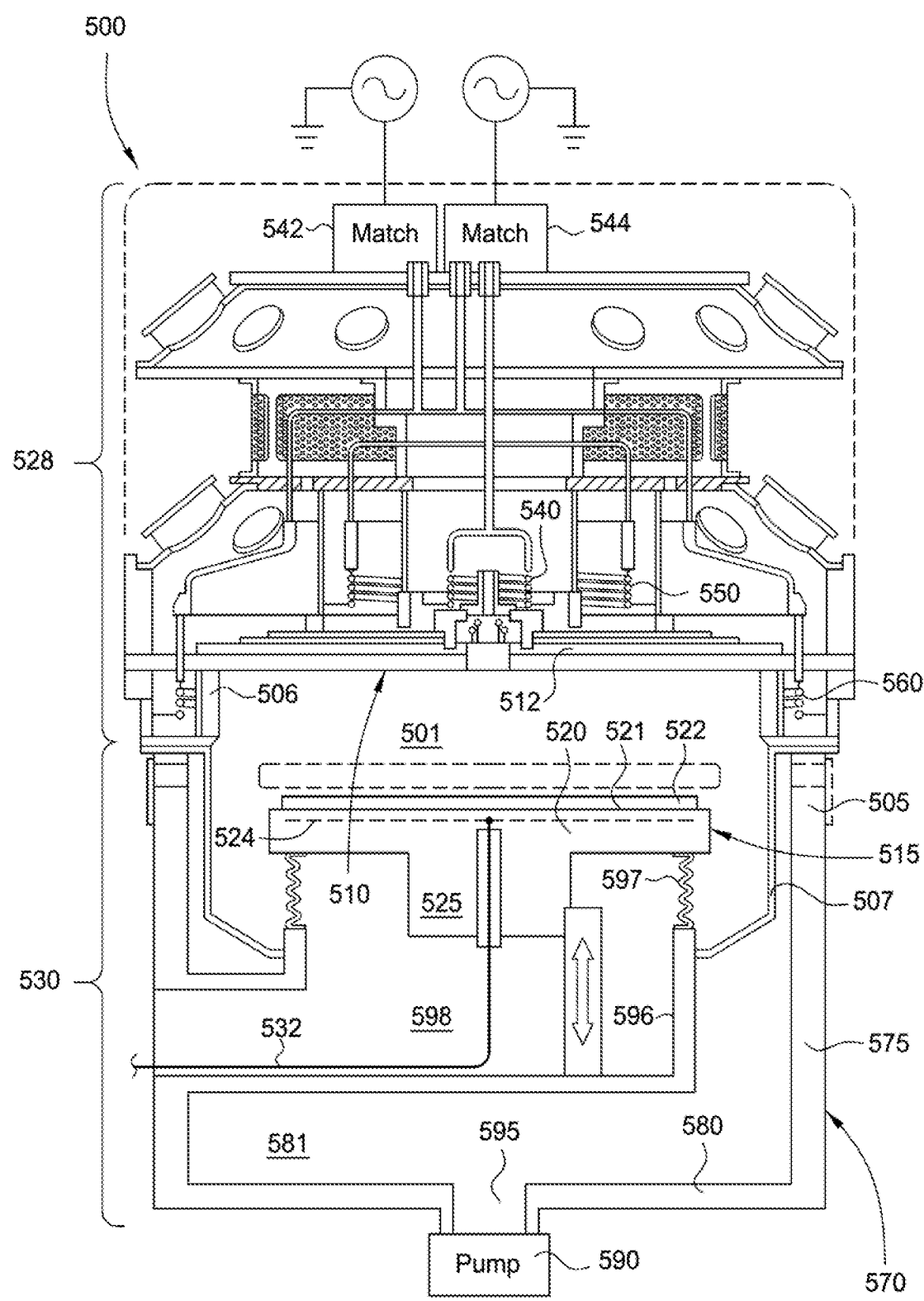
FIG. 5 is a cross sectional view of a processing chamber that may be used to perform the processing sequences described herein according to implementations described herein.

FIG. 4 is a schematic cross sectional view of a processing chamber 400 that may be adapted to perform any of the aforementioned capacitively coupled plasma processes. The processing chamber 400 may be a cleaning chamber. In one implementation, the processing chamber 400 is configured to produce a capacitively coupled plasma. The processing chamber 400 may be particularly useful for performing a thermal or plasma-based oxidation process and/or a plasma assisted dry etch process. The processing chamber 400 includes a chamber body 412, a lid assembly 414, and a support assembly 416. A substrate-processing region 401 of the processing chamber 400 is defined by the lid assembly 414, the support assembly 416, and the chamber body 412. The lid assembly 414 is disposed at an upper end of the chamber body 412, and the support assembly 416 is at least partially disposed within the chamber body 412. A vacuum system can be used to remove gases from processing chamber 400. The vacuum system includes a vacuum pump 418 coupled to a vacuum port 421 disposed in the chamber body 412.

The lid assembly 414 includes at least two stacked components configured to form a cavity or plasma volume 423 therebetween. A first electrode 420 is disposed vertically above a second electrode 422 confining the plasma volume 423. The first electrode 420 is connected to a power source 424, such as a radio frequency (RF) power supply, and the second electrode 422 is connected to ground or a source return, forming a capacitance between the first electrode 420 and the second electrode 422. The lid assembly 414 also includes one or more gas inlets 426 for providing a cleaning gas to a substrate surface through blocker plate 428 and gas distribution plate 430. The cleaning gas may be an etchant or ionized active radical, such as ionized fluorine, chlorine, or ammonia, or an oxidizing agent, such as ozone. Additionally, the processing chamber 400 includes a controller 402 for controlling processes within the processing chamber 400.

The support assembly 416 may include a substrate support 432 to support a substrate 410 thereon during processing. The substrate support 432 may be coupled to an actuator 434 by a shaft 436, which extends through a centrally located opening formed in a bottom surface of the chamber body 412. The actuator 434 may be flexibly sealed to the chamber body 412 by bellows (not shown) that prevent vacuum leakage from around the shaft 436. The actuator 434 allows the substrate support 432 to be moved vertically within the chamber body 412 between a process position and a lower, transfer position. The transfer position is slightly below the opening of a slit valve formed in a sidewall of the chamber body 412.

The substrate support 432 has a flat, or a substantially flat, surface for supporting a substrate to be processed thereon. The substrate support 432 may be moved vertically within the chamber body 412 by actuator 434 coupled thereto by shaft 436. In operation, the substrate support 432 may be elevated to a position in close proximity to the lid assembly 414 to control the temperature of the substrate 410 being processed. As such, the substrate 410 may be heated via radiation emitted or convection from the gas distribution plate 430.

A different cleaning process may be utilized to clean the substrate surface. In one implementation, a remote plasma containing He and $NF_3$ is introduced into a processing chamber through a gas distribution plate, such as a showerhead. $NH_3$ is directly injected into the chamber via a separate gas inlet.

FIG. 5 is a cross sectional view of a plasma-processing chamber 500 according to implementations described herein. The plasma-processing chamber 500 depicted in FIG. 5 includes an upper portion 528 and a lower portion 530. The plasma-processing chamber 500 has a sidewall 505 and a lid assembly 510. The sidewall 505 has an axially symmetrical shape, such as a cylinder. The sidewall 505 includes an axially symmetrical (e.g., cylindrical) dielectric side window 506 and a chamber liner 507, which may be formed of metal. A substrate support 515 inside the plasma-processing chamber 500 includes a pedestal 520 having a substrate support surface 521 facing the lid assembly 510 for holding a substrate 522, and a post 525 supporting the pedestal 520. The substrate-processing region 501 of the plasma-processing chamber 500 is confined by the lid assembly 510, the pedestal 520 and the sidewall 505. The pedestal 520 may include an insulated internal electrode 524. Optionally, an electrostatic chucking (ESC) voltage and/or RF plasma bias power may be supplied to the insulated internal electrode 524 via a cable 532 extending through the post 525. The cable 532 may be coupled to an RF bias power source (such as an RF impedance matching network and/or an RF power generator) as an RF bias feed to the insulated internal electrode 524. The cable 532 and may be provided as a coaxial transmission line, which may be rigid (or flexible), or as a flexible coaxial cable.

The plasma source power is inductively coupled into the substrate-processing region 501 by a set of coil antennas, including the inner coil antenna 540, the middle coil antenna 550 and optionally the outer or side coil antenna 560, all of which are concentrically disposed with respect to each other and are coaxial with the axis of symmetry of the sidewall 505. The lid assembly 510 includes a disk-shaped dielectric window through which the inner coil antenna 540 and the middle coil antenna 550 inductively couple RF plasma source power into the substrate-processing region 501. The disk-shaped dielectric window 512 is coaxial with the sidewall 505 and has a disk-plane parallel with the plane of the substrate support surface 521. The side coil antenna 560 inductively couples RF plasma source power into the substrate-processing region 501 through the dielectric side window 506. The dielectric windows 506 and 512 may be referred to collectively as a window assembly.

The chamber liner 507 is enclosed within a lower chamber body 570 including a cylindrical lower chamber body sidewall 575 and a lower chamber body floor 580. The cylindrical lower chamber body sidewall 575 and the lower chamber body floor 580 enclose an evacuation region 581. A vacuum pump 590 is disposed in a vacuum pump opening 595 in the lower chamber body floor 580 and is centered relative to the axis of symmetry of the cylindrical lower chamber body sidewall 575. A containment wall 596 coaxial with the substrate support 515 and a flexible bellows 597 extending between the pedestal 520 and the containment wall 596 enclose the substrate support 515 in an internal central space 598. The internal central space 598 is isolated from the volume evacuated by the vacuum pump 590, including the evacuation region 581 and the substrate-processing region 501.

The power may be supplied from a common RF source or from different RF sources such as RF matches (RF impedance matching networks) 542 and 544. An RF impedance matching network may be employed having dual outputs in order to drive two of the coil antennas with a first RF generator, while a second RF generator and a second RF impedance matching network drives the third coil antenna. Alternatively, three RF generators may separately drive the three coil antennas through three respective RF impedance matching networks. In yet another implementation, a single RF power generator may drive all three-coil antennas through an RF impedance matching network having three outputs. In some implementations of the foregoing implementations, the RF power levels applied to the different coil antennas may be separately adjusted in order to control radial distribution of plasma ion density. While described implementations include the three coil antennas 540, 550 and 560, other implementations may include only one or two of the three described coil antennas 540, 550 and 560.

Figure 6:
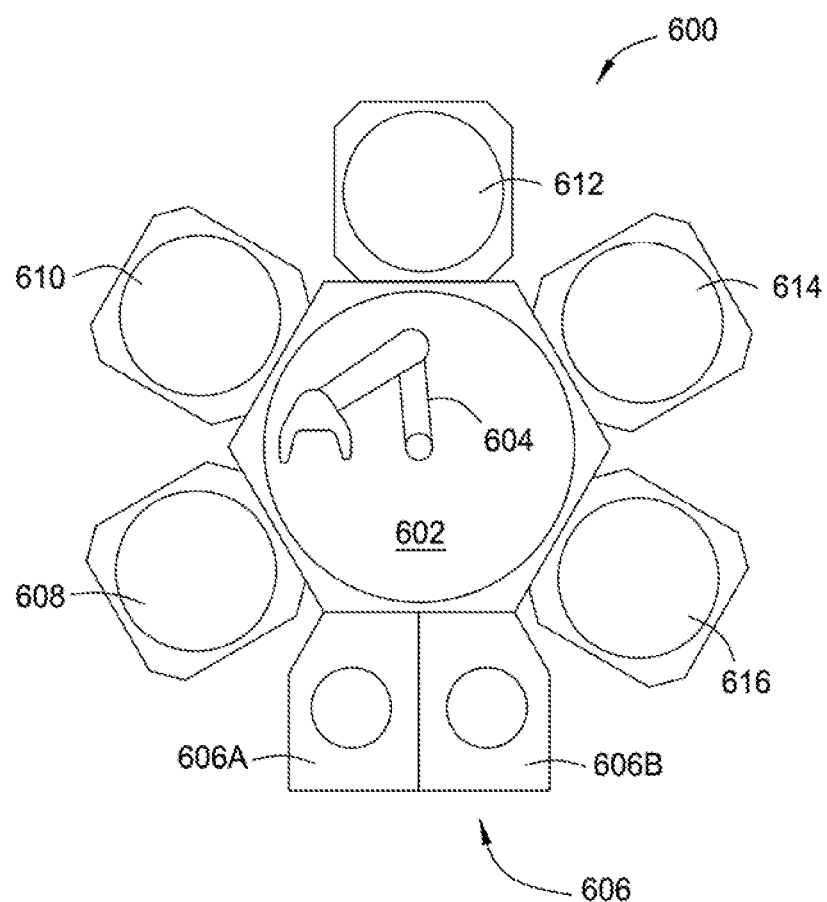
FIG. 6 is a schematic top view of a processing system that can be used to perform the processing sequences illustrated in FIG. 2 and FIG. 3 according to implementations described herein.

FIG. 6 is a schematic top view of a processing system that can be used to complete the processing sequences illustrated in FIG. 2 and FIG. 3 according to implementations described herein. One example of the processing system 600 is the CENTURA® system available from Applied Materials, Inc., of Santa Clara, Calif. A transfer robot 604 of any convenient type is disposed in a transfer chamber 602 of the processing system 600. A load-lock 606, with two vacuum compatible load-lock chambers 606A, 606B is coupled to the transfer chamber 602. A plurality of processing chambers 608, 610, 612, 614, and 616 are also coupled to the transfer chamber 602. The plurality of processing chamber 608, 610, 612, 614, and 616 may include at least one of a cleaning chamber, an etching chamber and deposition chambers, such as an epitaxial deposition chamber.

Processing chamber 608 may be a cleaning chamber configured to clean the substrate (e.g., operation 220; operation 320) prior to deposition. In some implementations, processing chamber 608 is also configured to remove residue from the substrate (e.g., operation 240, operation 340) prior to deposition. The processing chamber 608 may be configured to perform the Applied Materials SICONI® Preclean process. The processing chamber 608 may be a capacitively coupled processing chamber similar to the processing chamber 400 depicted in FIG. 4.

The processing chamber 616 may be an etching chamber for etching the substrate (e.g., operation 230; operation 330). The processing chamber 616 may be an inductively coupled plasma-processing chamber similar to the plasma-processing chamber 500 depicted in FIG. 5. In some implementations, processing chamber 616 is also configured to perform at least one of oxide removal (e.g., operation 320) and residue removal (e.g., operation 340) to remove residue from the substrate prior to deposition. In some implementations, oxide removal (e.g., operation 320), silicon etching (e.g., operation 330) and residue removal (e.g., operation 340) are all performed in an inductively coupled plasma-processing chamber such as processing chamber 616. Processing chambers 610, 612 and 614 may be a material deposition chamber such as an epitaxial deposition chamber capable of performing an epitaxial growth process (e.g., operation 250; operation 350).

The processing system 600 may be used to perform the processing sequence 200 or the processing sequence 300 described above. During processing, a substrate that is to be processed may arrive to the processing system 600 in a pod (not shown). The substrate is transferred from the pod to the vacuum compatible load-lock chambers 606A, 606B by the factory interface robot (not shown). The substrate is then handled by the transfer robot 604 in the transfer chamber 602, which is generally kept in a vacuum state. The transfer robot 604 then loads the substrate into either processing chamber 608 or processing chamber 616 for cleaning as described in operation 220 and operation 320. In implementations where operation 220 is performed in processing chamber 608, the transfer robot 604 then picks up the substrate from the processing chamber 608 and loads the substrate into the processing chamber 616 for etching as described in operation 230. The substrate may either remain in processing chamber 616 or the transfer robot 604 then picks up the substrate from the processing chamber 616 and loads the substrate into the processing chamber 608 for residue removal as described in operation 240 and operation 340. The transfer robot 604 then picks up the substrate from either processing chamber 608 or processing chamber 616 and loads the substrate into the processing chamber 610, 612 or 614, whichever is available, for material deposition. An epitaxial layer may be grown on the cleaned substrate in the processing chamber 610, 612 or 614 as described in operation 250 and operation 350. Because all operations (210, 220, 230, 240 and 250; 310, 320, 330, 340 and 350) are performed within the same processing system, the substrate is not exposed to atmosphere (e.g., vacuum is not broken) as the substrate is transferred to various chambers, which decreases the chance of contamination and improves the quality of the deposited epitaxial film.

The transfer chamber 602 may remain under vacuum and/or at a pressure below atmosphere during the process. The vacuum level of the transfer chamber may be adjusted to match the vacuum level of corresponding processing chambers. For example, when transferring a substrate from a transfer chamber into a processing chamber (or vice versa), the transfer chamber and the processing chamber may be maintained at the same vacuum level. Then, when transferring a substrate from the transfer chamber to the load lock chamber or batch load lock chamber (or vice versa), the transfer chamber vacuum level may match the vacuum level of the loadlock chamber or batch load lock chamber even through the vacuum level of the loadlock chamber or batch load lock chamber and the processing chamber may be different. Thus, the vacuum level of the transfer chamber may be adjusted. In certain implementations it may be desirable to backfill the transfer chamber with an inert gas such as nitrogen. In one implementation, the substrate is transferred in an environment having greater than 90% $N_2$. In certain implementations, the substrate is transferred in a high purity $NH_3$ environment. In one implementation, the substrate is transferred in an environment having greater than 90% $NH_3$. In certain implementations, the substrate is transferred in a high purity $H_2$ environment. In one implementation, the substrate is transferred in an environment having greater than 90% $H_2$.

In summary, some of the benefits of the present disclosure include improved cleaning of surfaces of a substrate prior to epitaxial deposition on the surface of the substrate. This improved cleaning of the substrate surface leads to an improvement of the quality of the subsequently formed epitaxial deposition layer. It has been found by the inventors that clustering processing chambers through vacuum transfer reduces exposure to atmosphere and correspondingly reduces exposure to oxygen contaminants. For example, performing inductively coupled plasma chlorine etching of silicon prior to epitaxial deposition without exposing the substrate to atmosphere (e.g., without breaking vacuum) between etching and deposition reduces exposure to oxygen contaminants. In some implementations, a native oxide removal process is performed followed by a silicon-etching process and an epitaxial deposition process. Since most native oxide removal processes are unstable and native oxide starts regrowing on the silicon-containing surface upon exposure to atmosphere. Clustering the native oxide removal chamber along with the etching of silicon and epitaxial deposition also leads to a reduction in oxygen contaminants. Further, the processes of native oxide removal, silicon etching, and residue removal after the silicon etching process can be performed in the same plasma-processing chamber reducing chamber footprint and associated costs.

As used herein "substrate" may be a support substrate with or without layers formed thereon. The patterned substrate may be an insulator or a semiconductor of a variety of doping concentrations and profiles and may be, for example, a semiconductor substrate of the type used in the manufacture of integrated circuits. Exposed "silicon" of the patterned substrate is predominantly Si but may include minority concentrations of other elemental constituents such as nitrogen, oxygen, hydrogen, carbon and the like. Exposed "silicon nitride" of the patterned substrate is predominantly $Si_3N_4$ but may include minority concentrations of other elemental constituents such as oxygen, hydrogen, carbon and the like. Exposed "silicon oxide" of the patterned substrate is predominantly $SiO_2$ but may include minority concentrations of other elemental constituents such as nitrogen, hydrogen, carbon and the like.

The term "precursor" is used to refer to any process gas, which takes part in a reaction to either remove material from or deposit material onto a surface. "Plasma effluents" are in an "excited state" wherein at least some of the gas molecules are in vibrationally-excited, dissociated and/or ionized states.

The terms "gap" and "trench" are used throughout with no implication that the etched geometry has a large horizontal aspect ratio. Viewed from above the surface, trenches may appear circular, oval, polygonal, rectangular, or a variety of other shapes. A trench may be in the shape of a moat around an island of material. The term "via" is used to refer to a low aspect ratio trench (as viewed from above) which may or may not be filled with metal to form a vertical electrical connection. As used herein, a conformal etch process refers to a generally uniform removal of material on a surface in the same shape as the surface, i.e., the surface of the etched layer and the pre-etch surface are generally parallel. A person having ordinary skill in the art will recognize that the etched interface likely cannot be 100% conformal and thus the term "generally" allows for acceptable tolerances.

Having disclosed several implementations, it will be recognized by those of skill in the art that various modifications, alternative constructions, and equivalents may be used without departing from the spirit of the disclosed implementations. Additionally, a number of well-known processes and elements have not been described in order to avoid unnecessarily obscuring the present disclosure. Accordingly, the above description should not be taken as limiting the scope of the disclosure.

When introducing elements of the present disclosure or exemplary aspects or implementation(s) thereof, the articles "a," "an," "the" and "said" are intended to mean that there are one or more of the elements.

The terms "comprising," "including" and "having" are intended to be inclusive and mean that there may be additional elements other than the listed elements.

All amounts, ratios, proportions and other measurements are by weight unless stated otherwise. All percentages refer to weight percent based on total composition according to the practice of the present disclosure unless stated otherwise.

While the foregoing is directed to implementations of the present disclosure, other and further implementations of the disclosure may be devised without departing from the basic scope thereof, and the scope thereof is determined by the claims that follow.

The invention claimed is:

1. A method of processing a substrate, comprising:
   transferring a patterned substrate into a substrate processing region, wherein the patterned substrate has a silicon-containing surface having native oxides formed thereon and positioned at a bottom of a high aspect ratio feature having a depth more than ten times a width of the high aspect ratio feature;
   removing the native oxides from the silicon-containing surface by a first plasma etch process, comprising:
      flowing a fluorine-containing precursor and a heavy inert gas into the substrate processing region while applying a first plasma power to form a plasma containing fluorine ions and heavy inert gas ions, wherein the first plasma etch process uses the plasma formed by one or more process gases consisting of the fluorine-containing precursor and the heavy inert gas; and
      etching the silicon-containing surface with the fluorine ions while applying a first bias to the substrate to remove the native oxides and form an etched silicon-containing surface;
   etching the etched silicon-containing surface by a second plasma etch process, comprising:
      flowing an etching gas mixture comprising a chlorine-containing precursor and a hydrogen-containing precursor into the substrate processing region while applying a second plasma power to form chlorine-containing ions and hydrogen-containing ions; and
      etching the etched silicon-containing surface with the chlorine-containing ions and the hydrogen-containing ions while applying a second bias to the substrate; and
   forming an epitaxial layer on the etched silicon-containing surface,
      wherein the first plasma etch process, the second plasma etch process, and forming the epitaxial layer are performed without exposing the patterned substrate to atmosphere,
      wherein the heavy inert gas is selected from the group consisting of: argon (Ar), krypton (Kr), xenon (Xe), and combinations thereof, and
      wherein a flow rate of the fluorine-containing precursor and the heavy inert gas result in a heavy inert gas-to-fluorine flow ratio of between 80:1 and 150:1.

2. The method of claim 1, wherein the fluorine-containing precursor is selected from the group consisting of: diatomic fluorine ($F_2$), monatomic fluorine (F), nitrogen trifluoride ($NF_3$), nitrogen pentafluoride ($NF_5$), sulfur hexafluoride ($SF_6$), xenon difluoride ($XeF_2$), carbon tetrafluoride ($CF_4$), octafluorocyclobutane ($C_4F_8$), trifluoromethane ($CHF_3$), hydrogen fluoride (HF), and combinations thereof.

3. The method of claim 2, wherein the first plasma etch process is an inductively coupled plasma etch process.

4. The method of claim 1, wherein the patterned substrate is maintained at a temperature between about 20 degrees Celsius and about 50 degrees Celsius.

5. The method of claim 1, wherein the first plasma etch process is performed at a pressure between about 5 mTorr and about 80 mTorr.

6. The method of claim 1, further comprising:
   removing etchant residue produced during the second plasma etch process from the silicon-containing surface of the patterned substrate by a third plasma etch process, comprising:
      flowing the chlorine-containing precursor and the hydrogen-containing precursor into the substrate processing region while applying a third plasma power to form chlorine-containing ions and hydrogen-containing ions; and
      etching the silicon-containing surface with the chlorine-containing ions and the hydrogen-containing ions, wherein the third plasma etch process is a bias-free process.

7. A method of processing a substrate, comprising:
   transferring a patterned substrate into a substrate processing region, wherein the patterned substrate has a silicon-containing surface having native oxides formed thereon and positioned at a bottom of a high aspect ratio feature having a depth more than ten times a width of the high aspect ratio feature;
   removing the native oxides from the silicon-containing surface by a first plasma etch process, comprising:
      flowing nitrogen trifluoride ($NF_3$) and argon gas into the substrate processing region while applying a first plasma power to form a plasma containing fluorine ions and argon ions, wherein the first plasma etch process uses the plasma formed by one or more process gases consisting of the $NF_3$ and the argon gas and a flow rate of $NF_3$ and argon gas results in an argon gas-to-$NF_3$ flow ratio of between 80:1 and 150:1; and
      etching the silicon-containing surface with the fluorine ions and the argon ions while applying a first bias to the substrate to remove the native oxides and form an etched silicon-containing surface;
   etching the etched silicon-containing surface by a second plasma etch process, comprising:
      flowing an etching gas mixture comprising a chlorine-containing precursor and a hydrogen-containing precursor into the substrate processing region while applying a second plasma power to form chlorine-containing ions and hydrogen-containing ions; and etching the etched silicon-containing surface with the chlorine-containing ions and the hydrogen-containing ions while applying a second bias to the substrate; and forming an epitaxial layer on the etched silicon-containing surface, wherein the first plasma etch process, the second plasma etch process, and forming the epitaxial layer on the etched silicon-containing surface of the patterned substrate are performed without exposing the patterned substrate to atmosphere.

8. The method of claim 7, wherein the first bias has a power level within a range from about 200 W to 400 W.

9. The method of claim 8, wherein the patterned substrate is maintained at a temperature between about 20 degrees Celsius and about 50 degrees Celsius.

10. The method of claim 9, wherein the first plasma etch process is performed at a pressure between about 5 mTorr and about 80 mTorr.

11. The method of claim 7, further comprising:
removing etchant residue produced during the second plasma etch process from the silicon-containing surface of the patterned substrate by a third plasma etch process, comprising:
flowing the chlorine-containing precursor and the hydrogen-containing precursor into the substrate processing region while applying a third plasma power to form chlorine-containing ions and hydrogen-containing ions; and
etching the silicon-containing surface with the chlorine-containing ions and the hydrogen-containing ions, wherein the third plasma etch process is a bias-free process.

12. A method of processing a substrate, comprising:
transferring a patterned substrate into a substrate processing region, wherein the patterned substrate has a silicon-containing surface having native oxides formed thereon and positioned at a bottom of a high aspect ratio feature having a depth more than ten times a width of the high aspect ratio feature;
removing the native oxides from the silicon-containing surface by a first plasma etch process, comprising:
flowing a fluorine-containing precursor and a heavy inert gas precursor into the substrate processing region while applying a first plasma power to bombard the silicon-containing surface with fluorine ions while applying a first bias to the substrate, wherein the first plasma etch process uses a plasma formed by one or more process gases consisting of the fluorine-containing precursor and the heavy inert gas precursor;
etching the silicon-containing surface by a second plasma etch process, comprising:
flowing an etching gas mixture comprising a chlorine-containing precursor and a hydrogen-containing precursor into the substrate processing region while applying a second plasma power to form chlorine-containing ions and hydrogen-containing ions; and
etching the silicon-containing surface with the chlorine-containing ions and the hydrogen-containing ions while applying a second bias to the substrate;

removing etchant residue produced during the second plasma etch process from the silicon-containing surface of the patterned substrate by a third plasma etch process, comprising:
flowing the chlorine-containing precursor and the hydrogen-containing precursor into the substrate processing region while applying a third plasma power to form chlorine-containing ions and hydrogen-containing ions; and
etching the silicon-containing surface with the chlorine-containing ions and the hydrogen-containing ions, wherein the third plasma etch process is a bias-free process; and
forming an epitaxial layer on the etched silicon-containing surface of the patterned substrate,
wherein the first plasma etch process, the second plasma etch process, the third plasma etch process and forming the epitaxial layer on the etched silicon-containing surface of the patterned substrate are performed without exposing the patterned substrate to atmosphere, and
wherein a flow rate of the fluorine-containing precursor and the heavy inert gas precursor result in a heavy inert gas-to-fluorine flow ratio of between 80:1 and 150:1.

13. The method of claim 12, wherein the heavy inert gas precursor is selected from the group consisting of: argon (Ar), krypton (Kr), xenon (Xe), and combinations thereof.

14. The method of claim 12, wherein the fluorine-containing precursor is selected from the group consisting of: diatomic fluorine ($F_2$), monatomic fluorine (F), nitrogen trifluoride ($NF_3$), nitrogen pentafluoride ($NF_5$), sulfur hexafluoride ($SF_6$), xenon difluoride ($XeF_2$), carbon tetrafluoride ($CF_4$), octafluorocyclobutane ($C_4F_8$), trifluoromethane ($CHF_3$), hydrogen fluoride (HF), and combinations thereof.

15. The method of claim 12, wherein the hydrogen-containing precursor is selected from the group consisting of: atomic hydrogen, molecular hydrogen, ammonia, and combinations thereof.

16. The method of claim 12, wherein the etching gas mixture further comprises an inert sputtering agent.

17. The method of claim 16, wherein the inert sputtering agent is argon.

18. The method of claim 12, wherein the first plasma etch process is an inductively coupled plasma etch process.

19. The method of claim 12, wherein the patterned substrate is maintained at a temperature between about 20 degrees Celsius and about 50 degrees Celsius.

20. The method of claim 12, wherein the chlorine-containing precursor is chlorine gas and the hydrogen-containing precursor is hydrogen gas.

* * * * *